United States Patent
Chuang et al.

(10) Patent No.: US 12,080,768 B2
(45) Date of Patent: Sep. 3, 2024

(54) TRANSISTOR, SEMICONDUCTOR STRUCTURE, AND MANUFACTURING METHOD THEREOF

(71) Applicant: Taiwan Semiconductor Manufacturing Company, Ltd., Hsinchu (TW)

(72) Inventors: Ming-Yen Chuang, Hsinchu (TW); Chang-Lin Yang, Taoyuan (TW); Katherine H. Chiang, New Taipei (TW); Mauricio Manfrini, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 265 days.

(21) Appl. No.: 17/407,097

(22) Filed: Aug. 19, 2021

(65) Prior Publication Data
US 2023/0058626 A1    Feb. 23, 2023

(51) Int. Cl.
| | | |
|---|---|---|
| H01L 29/417 | (2006.01) | |
| H01L 27/06 | (2006.01) | |
| H01L 29/40 | (2006.01) | |
| H01L 29/423 | (2006.01) | |
| H01L 29/45 | (2006.01) | |
| H01L 29/66 | (2006.01) | |
| H01L 29/786 | (2006.01) | |

(52) U.S. Cl.
CPC .... *H01L 29/41775* (2013.01); *H01L 27/0617* (2013.01); *H01L 29/401* (2013.01); *H01L 29/41733* (2013.01); *H01L 29/41741* (2013.01); *H01L 29/42384* (2013.01); *H01L 29/45* (2013.01); *H01L 29/66742* (2013.01); *H01L 29/78642* (2013.01); *H01L 29/7869* (2013.01); *H01L 2029/42388* (2013.01)

(58) Field of Classification Search
CPC .......... H01L 29/41775; H01L 29/7869; H01L 29/78642; H01L 29/42384
See application file for complete search history.

(56) References Cited

U.S. PATENT DOCUMENTS

| | | | | |
|---|---|---|---|---|
| 3,660,735 | A * | 5/1972 | McDougall | ........... H01L 23/291 257/369 |
| 9,117,920 | B2 * | 8/2015 | Koezuka | ........... H01L 29/78693 |
| 9,209,284 | B2 * | 12/2015 | Zhao | ................. H01L 29/66977 |
| 9,337,309 | B1 * | 5/2016 | Basu | ................. H01L 29/66666 |
| 9,825,060 | B2 * | 11/2017 | Sasaki | ............... H01L 29/41733 |
| 10,943,953 | B2 * | 3/2021 | Karda | ................. H01L 29/4908 |

(Continued)

OTHER PUBLICATIONS https://en.wikipedia.org/wiki/Front_end_of_line#/media/File:Cmos-chip_structure_in_2000s_(en).svg (Year: 2016).*

*Primary Examiner* — Incent Wall
(74) *Attorney, Agent, or Firm* — JCIPRNET

(57) ABSTRACT

A transistor includes a gate electrode, a gate dielectric layer covering the gate electrode, an active layer covering the gate dielectric layer and including a first metal oxide material, and source/drain electrodes disposed on the active layer and made of a second metal oxide material with an electron concentration of at least about $10^{18}$ cm$^{-3}$. A semiconductor structure and a manufacturing method are also provided.

20 Claims, 13 Drawing Sheets

(56) References Cited

U.S. PATENT DOCUMENTS

| | | | |
|---|---|---|---|
| 2005/0017302 A1* | 1/2005 | Hoffman | H01L 29/78696 |
| | | | 438/149 |
| 2006/0175609 A1* | 8/2006 | Chan | H01L 29/78696 |
| | | | 438/149 |
| 2008/0251825 A1* | 10/2008 | Lee | H01L 29/42392 |
| | | | 257/E29.264 |
| 2011/0089417 A1* | 4/2011 | Yamazaki | H01L 29/7869 |
| | | | 257/43 |
| 2013/0069052 A1* | 3/2013 | Sandhu | H01L 21/8254 |
| | | | 257/E27.084 |
| 2014/0021485 A1* | 1/2014 | Cho | H10B 12/05 |
| | | | 257/77 |
| 2015/0287745 A1* | 10/2015 | Kato | H01L 27/0688 |
| | | | 257/43 |
| 2019/0348540 A1* | 11/2019 | Pillarisetty | H01L 21/823475 |
| 2021/0242225 A1* | 8/2021 | Manfrini | H10B 53/00 |
| 2021/0375990 A1* | 12/2021 | Young | H01L 29/78642 |
| 2023/0058626 A1* | 2/2023 | Chuang | H01L 29/7869 |

\* cited by examiner

TRANSISTOR, SEMICONDUCTOR STRUCTURE, AND MANUFACTURING METHOD THEREOF

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Although existing ICs have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
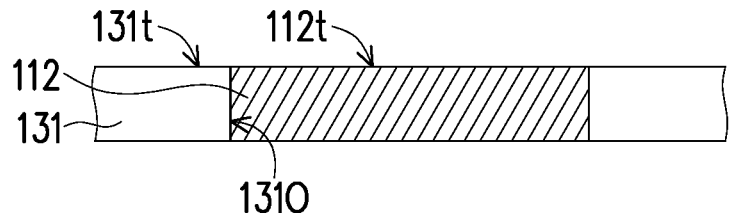
FIGS. 1A-1C are cross-sectional views illustrating various stages of a manufacturing method of a transistor according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
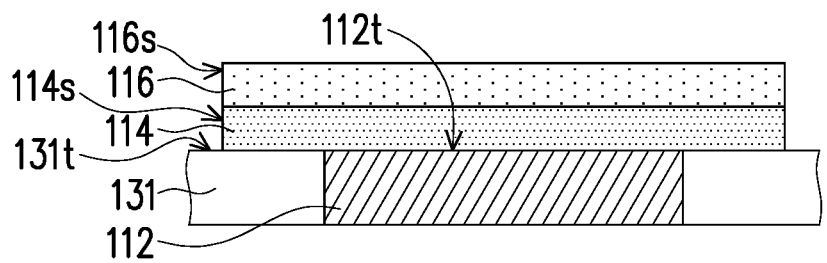
Figure 1C:
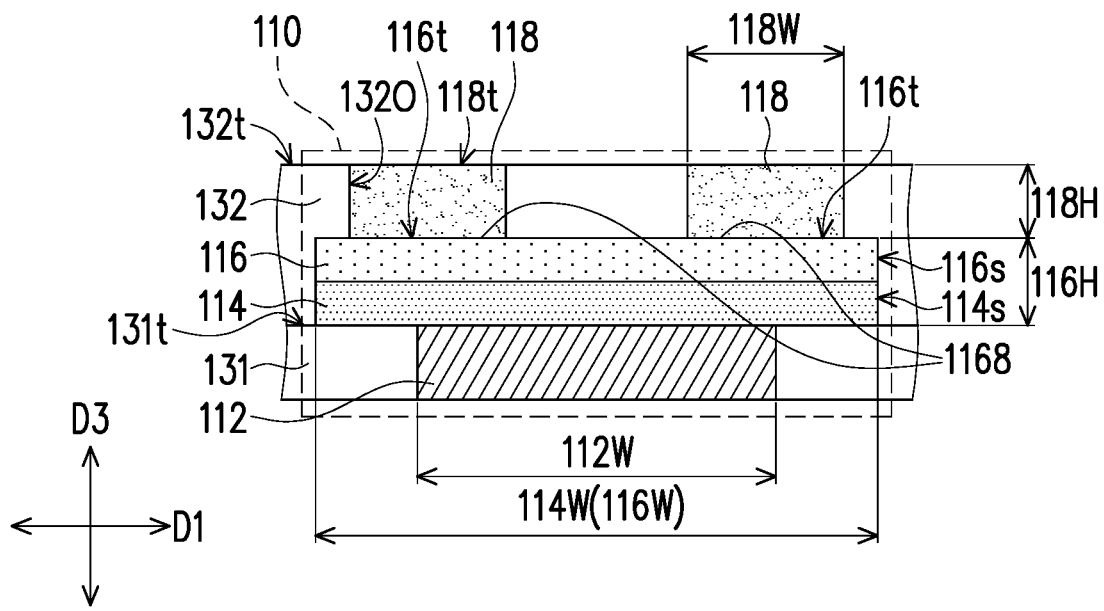

FIGS. 1A-1C are cross-sectional views illustrating various stages of a manufacturing method of a transistor according to some embodiments. Referring to FIG. 1A, a gate electrode 112 is formed in a dielectric sublayer 131. In some embodiments, a metallic material of the gate electrode 112 includes silver, aluminum, copper, tungsten, nickel, other suitable materials, alloys thereof, combinations thereof, and/or the like. In some embodiments, the gate electrode 112 includes a metal compound such as titanium nitride, tantalum nitride, metal silicide, other suitable materials, combinations thereof, and/or the like. In some embodiments, the gate electrode 112 includes polycrystalline silicon, doped silicon, and/or the like. The gate electrode 200 may include p-type work function materials or n-type work function materials. In some embodiments, the dielectric sublayer 131 includes one or more dielectric sublayers formed of low-k dielectric. For example, the dielectric sublayer 131 includes Phospho-Silicate Glass (PSG), Boro-Silicate Glass (BSG), Boron-Doped Phospho-Silicate Glass (BPSG), undoped Silicate Glass (USG), the like, or combinations thereof. In some embodiments, the dielectric sublayer 131 includes an oxide (e.g., silicon oxide), a nitride (e.g., silicon nitride), and/or any suitable electrically insulating material. For example, the dielectric sublayer 131 is a part of an interlayer dielectric (ILD) layer that is formed over the front surface of a semiconductor substrate as will be described later in accompanying with FIGS. 2A-2B.

The gate electrode 112 may be formed by suitable fabrication techniques such as a damascene gate formation process. In some embodiments, the dielectric sublayer 131 is first patterned to form an opening 131O therein through a photolithography and etching process. For example, the etching process includes an anisotropic etching process (e.g., dry etch) or an isotropic etching process (e.g., wet etch). In some embodiments, an etchant for the wet etch includes a combination of hydrogen fluoride (HF) and ammonia ($NH_3$), a combination of HF and tetramethylammonium hydroxide (TMAH), or the like. On the other hand, the dry etch process includes, for example, reactive ion etch (RIE), inductively coupled plasma (ICP) etch, electron cyclotron resonance (ECR) etch, neutral beam etch (NBE), and/or the like. Subsequently, the metallic material(s) may be formed over the dielectric sublayer 131 and in the opening 131O of the dielectric sublayer 131. The metallic material(s) may be deposited through chemical vapor deposition (CVD), physical vapor deposition (PVD), atomic layer deposition (ALD), or the like. Thereafter, a planarization process may be performed on the metallic material(s) until the dielectric sublayer 131 is accessibly exposed to form the gate electrode 112 that is embedded in the dielectric sublayer 131. For example, the planarization process includes a chemical mechanical polishing (CMP) process, a mechanical grinding process, an etching process, a combination thereof, or the like. In some embodiments, after the planarization process, a top surface 112t of the gate electrode 112 is substantially leveled (e.g., coplanar) with a top surface 131t of the dielectric sublayer 131, within process variations.

Referring to FIG. 1B and with reference to FIG. 1A, a gate dielectric layer 114 is formed on the gate electrode 112 and the dielectric sublayer 131, and an active layer 116 is formed on the gate dielectric layer 114. In some embodiments, the gate dielectric layer 114 includes high-k dielectric material(s) which may have a dielectric constant higher than 4, greater than about 12, greater than about 16, or even greater than about 20. For example, a material of the gate dielectric layer 114 includes silicon oxide, silicon nitride, silicon oxynitride, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), zirconium silicate, zirconium aluminate, zirconium oxide, titanium oxide, aluminum oxide ($Al_2O_3$), a hafnium dioxide-alumina ($HfO_2$—$Al_2O_3$) alloy, combinations thereof, and/or the like.

In some embodiments, the active layer 116 includes metal oxide material(s) such as indium gallium zinc oxide (InGaZnO or called "IGZO"), tungsten-doped indium oxide (InWO), indium zinc oxide (InZnO), indium tin oxide (InSnO), Zinc oxide (ZnO), gallium oxide (GaOx), indium oxide (InOx), aluminum zinc oxide (AZO), or combinations thereof. The electrical properties of metal oxide materials may depend on the doping level within the metal oxide materials, and the nature of the doping element and the doping level may be selected to tailor the properties of the metal oxide materials. In some embodiments, the active layer 116 may be lightly doped with a free electron concentration (Nd) less than about $10^{18}$ cm$^{-3}$. Alternatively, the active layer 116 may have the free electron concentration substantially equal to about $10^{18}$ cm$^{-3}$. In some embodiments, the active layer 116 is referred to as a channel layer.

The gate dielectric layer 114 and the active layer 116 may be formed by suitable fabrication techniques. For example, a layer of gate dielectric material is formed on the top surface 112t of the gate electrode 112 and the top surface 131t of the dielectric sublayer 131 by any suitable deposition process (e.g., ALD, PVD, CVD, and/or the like), and then a layer of active material is formed on the layer of gate dielectric material by any suitable deposition process (e.g., ALD, PVD, CVD, and/or the like). Subsequently, a portion of the layer of gate dielectric material and an overlying portion of the layer of active material may be removed to accessibly reveal a portion of the top surface 131t of the dielectric sublayer 131 through a lithography process and an etching process or any suitable patterning process. The gate dielectric layer 114 and the active layer 116 are then formed after the lithography process and etching processes. For example, the lithography process includes photoresist coating, soft baking, exposing, post-exposure baking, developing, and hard baking. The etching process may include anisotropic etching process (e.g., dry etch) or an isotropic etching process (e.g., wet etch). In some embodiments where the dry etch is employed, a sidewall 116s of the active layer 116 and a sidewall 114s of the gate dielectric layer 114 underlying the active layer 116 are substantially vertical. For example, the sidewall 116s of the active layer 116 and the sidewall 114s of the gate dielectric layer 114 are substantially aligned (or leveled) with one another, within process variations.

Referring to FIG. 1C and with reference to FIG. 1B, source/drain electrodes 118 are formed on the active layer 116 and embedded in a dielectric sublayer 132. The material of the dielectric sublayer 132 may be the same as or similar to the material of the underlying dielectric sublayer 131. In some embodiments, the dielectric sublayers 131 and 132 are collectively viewed as the dielectric layer 13 which may be a part of the ILD layer. In some embodiments, the source/drain electrodes 118 include conductive metal oxide material(s) such as IGZO, InWO, InZnO, InSnO, ZnO, GaOx, InOx, AZO, combinations thereof, and/or the like. The material of the source/drain electrodes 118 may be the same as or similar to the material of the active layer 116, except that a free electron concentration (or a doping density) of the source/drain electrodes 118 may be substantially greater than that of the active layer 116. For example, the source/drain electrodes 118 may be highly doped and therefore highly conductive, compared to the active layer 116. In some embodiments, the source/drain electrodes 118 include a conducting oxide material having a free electron concentration (Nd)≥about $10^{18}$ cm$^{-3}$.

The source/drain electrodes 118 may be formed by suitable fabrication techniques. In some embodiments, a layer of dielectric material is formed on the top surface 131t of the dielectric sublayer 131 to cover a stack of the gate dielectric layer 114 and the active layer 116 by any suitable deposition process, and then a portion of the layer of dielectric material is removed to form the dielectric sublayer 132 with openings 1320 by photolithography and etching processes or any suitable patterning process. The formation process of the dielectric sublayer 132 may be similar to that of the underlying dielectric sublayer 131. For example, the openings 1320 accessibly expose at least a portion of the top surface 116t of the active layer 116, and the sidewall 116s of the active layer 116 and the sidewall 114s of the underlying gate dielectric layer 114 are covered by the dielectric sublayer 132. Subsequently, the metal oxide material(s) may be formed over the dielectric sublayer 132 and in the openings 1320 of the dielectric sublayer 132 by any suitable deposition process (e.g., CVD, PVD, ALD, or the like). In such embodiments, the metal oxide material is formed by depositing a metal and subsequently oxidizing the metal, or by depositing a metal oxide. The metal oxide material(s) may be doped with dopant during the deposition process or after the deposition process. For example, the metal oxide material(s) may be heavily doped (with metal ions) with the free electron concentration of at least about $10^{18}$ cm$^{-3}$. Thereafter, a planarization process (e.g., CMP, mechanical grinding, etching, a combination thereof, or the like) may be performed on the conductive metal oxide material(s) until the dielectric sublayer 132 is accessibly exposed to form the source/drain electrodes 118. In some embodiments, after the planarization process, top surfaces 118t of the source/drain electrodes 118 are substantially leveled (e.g., coplanar) with a top surface 132t of the dielectric sublayer 132, within process variations.

With continued reference to FIG. 1C, a transistor 110 covered by the dielectric layer 13 is provided. The transistor 110 includes the gate electrode 112, the active layer 116 disposed over the gate electrode 112, the gate dielectric layer 114 interposed between the gate electrode 112 and the active layer 116, and the source/drain electrodes 118 overlying the active layer 116. In some embodiments, the transistor 110 is referred to as a planar thin film transistor (TFT), given its arrangement. In some embodiments, the gate electrode 112 has a substantially rectangular cross section which is elongated in a first direction D1. The gate dielectric layer 114, the active layer 116, and the source/drain electrodes 118 may be sequentially stacked upon the gate electrode 112 in a third direction D3 (e.g., the thickness direction of the gate electrode 112), where the third direction D3 is substantially perpendicular to the first direction D1. For example, in a bottom-up view (not shown), the gate electrode 112 at least partially overlaps the respective source/drain electrode 118. In some embodiments, a lateral dimension 112W of the gate electrode 112 is substantially less than a lateral dimension 114W of the overlying gate dielectric layer 114 and also substantially less than a lateral dimension 116W of the active layer 116, where the lateral dimension 114W of the gate dielectric layer 114 may be substantially equal to the lateral dimension 116W of the active layer 116.

The material of the gate electrode 112 and the material of the source/drain electrodes 118 are different. As mentioned above, the gate electrode 112 may include metallic material(s), while the source/drain electrodes 118 may include conductive oxide material(s). The active layer 116 and the source/drain electrodes 118 may be made of metal oxide materials, except that the active layer 116 has a low electron concentration and the source/drain electrodes 118 have a high electron concentration. For example, a highly doped layer of conducting oxide is formed to act as the source/drain electrodes 118. The active layer 116 may act as a channel for electron to travel when the transistor 110 is turned on. In some embodiments, the source/drain electrodes 118 may have the electron concentration (or doping concentration) greater than (or substantially equal to) about $10^{18}$ cm$^{-3}$, and the active layer 116 may have the electron concentration (or doping concentration) substantially equal to or less than about $10^{18}$ cm$^{-3}$, where the electron concentration of the source/drain electrodes 118 may be greater than that of the active layer 116. This illustrates some advantages of the present disclosure, such as simpler fabrication process (e.g., no need to form metallic source/drain electrodes) and lower manufacturing cost. By employing the highly doped metal oxide layers as the source/drain electrodes, the transistor 110 may have a good interface quality between the source/drain electrodes 118 and the active layer 116. For example, the height of the Schottky barrier at an interface 116B between the source/drain electrodes 118 and the active layer 116 is minimal (or may be negligible), and the contact resistance may be sufficiently increased, thereby leading to higher device performance.

In the manufacturing of the transistor 110, the device dimension may be further scaled down. For example, the dimensions of the source/drain electrodes 118 may shrink down to submicron range. In some embodiments, a thickness 118H of the respective source/drain electrode 118 may be less than about 100 nm and may be greater than about 5 nm. It should be appreciated that if the thicknesses of the source/drain electrodes are greater than 100 nm, the resistance is increased and may be higher than the conventional source/drain electrodes which are made of metallic materials, and if the thicknesses of the source/drain electrodes are less than 5 nm, the source/drain electrodes made of highly doped metal oxide materials may be depleted and thus increase the effective contact resistance. The source/drain electrodes 118 may be wide enough for source/drain contacts (shown in FIGS. 2A-2B) landing thereon. In some embodiments, a lateral dimension 118W (e.g., the top width or the bottom width) of the respective source/drain electrode 118 is about 30 nm±10%. In some embodiments, the thickness 116H of the active layer 116 is less than the thickness 118H of the respective source/drain electrode 118. For example, the thickness 116H of the active layer 116 is in a range of about 1 nm and about 100 nm. Alternatively, the active layer 116 and the source/drain electrodes 118 may have a substantially same thickness, or the active layer 116 may be substantially thicker than the source/drain electrodes 118.

Figure 2A:
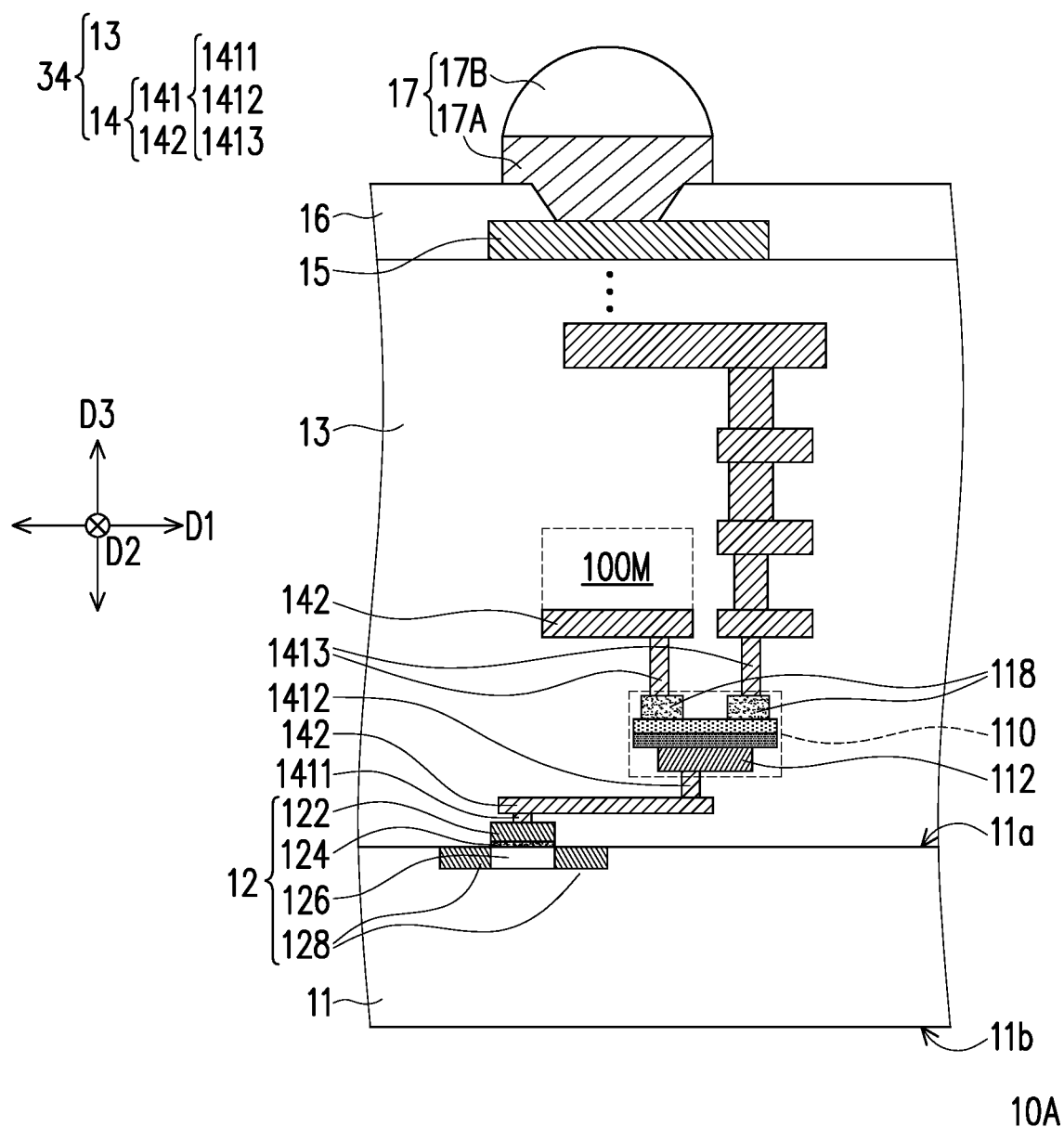
FIGS. 2A and 2B are cross-sectional views illustrating a semiconductor structure including the transistor in FIG. 1C according to some embodiments.
Figure 2B:
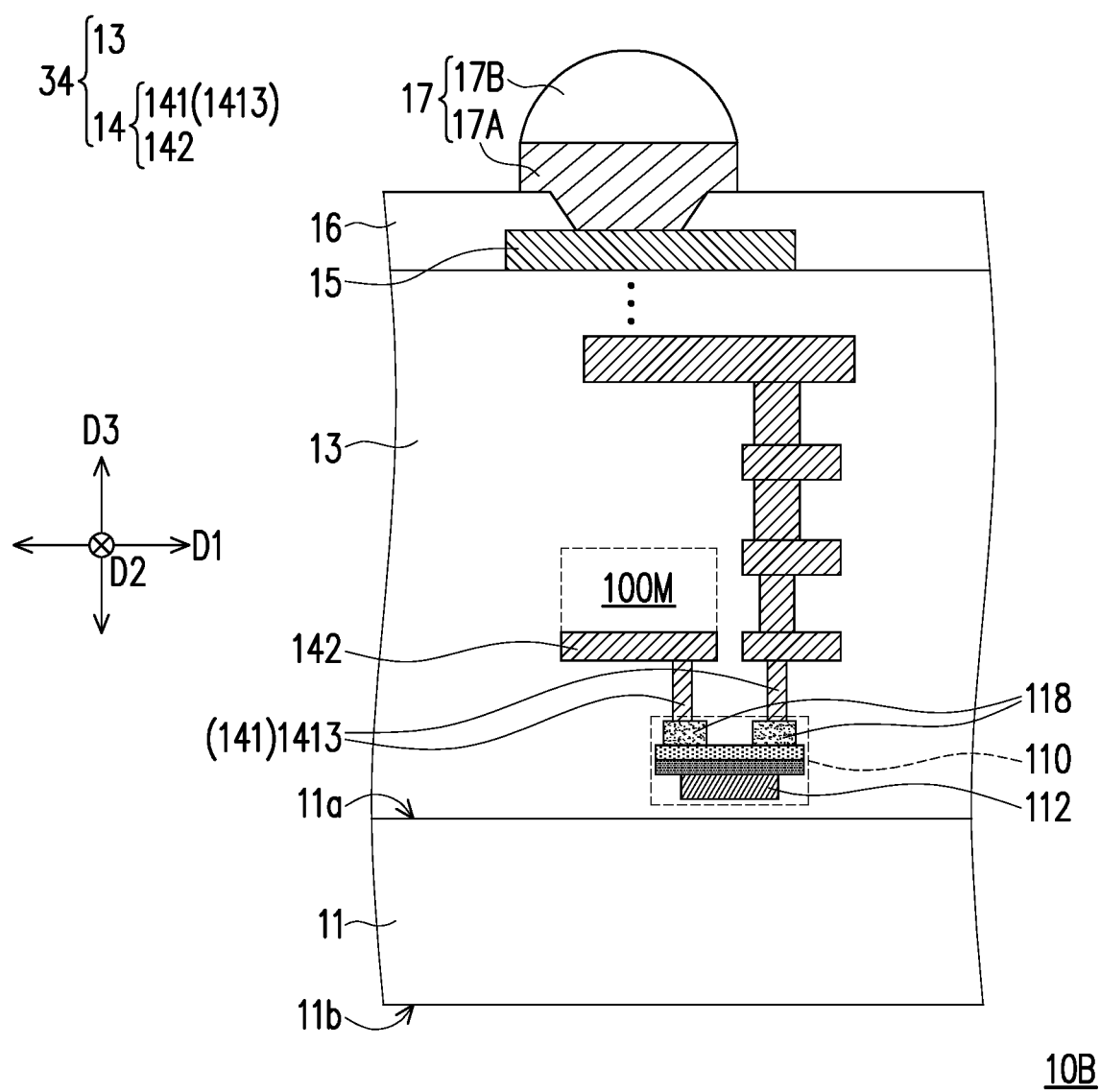

FIGS. 2A and 2B are cross-sectional views illustrating a semiconductor structure including the transistor 110 in FIG. 1C according to some embodiments. Unless specified otherwise, the materials and the formation methods of the components in these embodiments are essentially the same as the like components, which are denoted by like reference numerals in the embodiments shown in FIGS. 1A-1C.

Referring to FIG. 2A and with reference to FIG. 1C, a semiconductor structure 10A includes the transistor 110 embedded in the dielectric layer 13 that is formed over a semiconductor substrate 11. For example, the semiconductor substrate 11 includes silicon substrate (doped or undoped) or an active layer of a semiconductor-on-insulator (SOI) substrate. The semiconductor substrate 11 may include other semiconductor materials (e.g., germanium), a compound semiconductor material (e.g., silicon carbide, gallium arsenic, gallium phosphide, indium phosphide, indium arsenide, and/or indium antimonide), alloy semiconductor material (e.g., SiGe, GaAsP, AlInAs, AlGaAs, GaInAs, GaInP, and/or GaInAsP), or combinations thereof. Other substrate (e.g., a multi-layered substrate or a gradient substrate) may be used. The semiconductor substrate 11 may have a first surface 11a and a second surface 11b opposite to each other, and the dielectric layer 13 may be formed on the first surface 11a.

In some embodiments, the semiconductor structure 10A includes a device (represented by a transistor) 12 formed at the first surface 11a of the semiconductor substrate 11. For simplicity, one device 12 is shown; however, it should be understood that a plurality of devices 12 may be embedded in the semiconductor substrate 11, depending on the design of the semiconductor structure 10A. When multiple devices 12 are present, these devices 12 may be separated by shallow trench isolation (STI; not shown) formed in the semiconductor substrate 11 and located between two adjacent devices 12. In some embodiments, the semiconductor substrate 11 includes various doped regions depending on circuit requirements (e.g., p-type semiconductor substrate or n-type semiconductor substrate). The doped regions may be doped with p-type or n-type dopants, and these doped regions may serve as source/drain regions 128 of the device 12 embedded in the semiconductor substrate 11. In some embodiments, the device 12 is a TFT, the device 12 may include a metal gate 122, a channel 126 below the metal gate 122, and a gate dielectric 124 interposed between the metal gate 122 and the channel 126. The channel 126 may be located between the source/drain regions 128 to serve as a path for electron to travel when the device 12 is turned on. In some embodiments, the device 12 is formed using suitable Front-end-of-line (FEOL) process and may be referred to as a FEOL device. Depending on the circuit requirement, the device 12 may be completely embedded in the semiconductor substrate 11 or partially embedded in the semiconductor substrate 11. It should be understood that the device 12 illustrated herein is merely an example, and according to some embodiments, the device 12 may be or may include an active device (e.g., transistor, diode, etc.), a passive device (e.g., capacitor, resistor, inductor), etc.

With continued reference to FIGS. 2A and 1C, the dielectric layer 13 overlying the first surface 11a of the semiconductor substrate 11 may cover the top portion of the device 12. The dielectric layer 13 may include one or more dielectric sublayer(s) as mentioned in the preceding paragraphs. In some embodiments, the semiconductor structure 10A includes interconnect circuitries 14 embedded in the dielectric layer 13 and interconnecting the device 12 and other electric devices to form an integrated circuit. In some embodiments, the dielectric layer 13 and the interconnect circuitries 14 are collectively viewed as an interconnect structure 34. The interconnect structure 34 may be formed using suitable back-end-of-line (BEOL) process.

In some embodiments, the interconnect circuitries 14 includes conductive vias 141 and conductive lines 142, where the conductive lines 142 on each level extend along the first direction D1 and/or a second direction D2 (e.g., extend on the XY plane), and the conductive vias 141 extend along the third direction D3 (e.g., the thickness direction of the semiconductor structure 10A or the Z direction) to couple adjacent levels of the conductive lines 142. The first direction D1, the second direction D2, and the third direction D3 may be substantially perpendicular to one another. In some embodiments, the interconnect structure 34 is formed of alternating layers of dielectric (e.g., dielectric sublayers) and conductive patterns with conductive vias interconnecting the layers of conductive patterns and may be formed through any suitable process (such as deposition, damascene, dual damascene, or the like). The bottommost conductive via 1411 embedded in the dielectric layer 13 may electrically and physically couple to the device 12. For simplicity, only one bottommost conductive via 1411 is illustrated; however, it should be understood that a plurality of bottommost conductive vias may be formed to couple the metal gate and source/drain regions of the device 12.

In some embodiments, the transistor 110 is formed over the device 12, where the gate electrode 112 disposed in proximity to the first surface 11a of the semiconductor substrate 11, and the source/drain electrodes 118 are disposed away from the first surface 11a of the semiconductor substrate 11 relative to the gate electrode 112. In some embodiments, the transistor 110 embedded in the interconnect structure 34 may be referred to as a BEOL device. For example, the conductive via 1412 formed over the conductive via 1411 may electrically and physically couple to the gate electrode 112 of the transistor 110, and the conductive vias 1413 formed over the conductive via 1412 may electrically and physically couple to the source/drain electrodes 118 of the transistor 110. The conductive via 1142 that is in physical and direct contact with the gate electrode 112 of the transistor 110 may be referred to as gate contact. The conductive vias 1413 that are in physical and direct contact with the source/drain electrodes 118 of the transistor 110 may be viewed as source/drain contacts. As mentioned in FIG. 1C, the source/drain electrodes 118 are planarized to render the planar top surfaces. For example, an entirety of the top surface 118t (labeled in FIG. 1C) of the respective source/drain electrode 118 is planar and is free of recess. In some embodiments, each of the conductive vias 1413 may land on one of the top surfaces 118t of the source/drain electrodes 118. For example, only the bottom end surfaces of the conductive vias 1413 are in direct contact with the source/drain electrodes 118, and the entire sidewalls of the conductive vias 1413 are covered by the dielectric layer 13.

In some embodiments, the device 12 is electrically coupled to the transistor 110 through the interconnect circuitries (e.g., 1411, 1412, and 142). For example, the device 12 is a first transistor disposed within the semiconductor substrate 11, while the transistor 110 is a second transistor disposed above the semiconductor substrate 11. It should be understood that the configuration shown in FIG. 2A is merely an example, the routing of the interconnect circuitries and the electrical path between the device 12 and the transistor 110 may vary depending on circuit and product requirements. In addition, the number of the transistor 110 in the semiconductor structure 10A construes no limitation in the disclosure. The transistor 110 may be disposed at the bottom portion of the interconnect structure 34 which is close to the semiconductor substrate 11 and/or disposed at the middle portion (or the top portion) of the interconnect structure 34. For example, a plurality of transistors 110 are arranged in an array in the interconnect structure 34 or may be disposed at different levels in the interconnect structure 34.

With continued reference to FIGS. 2A and 1C, a memory cell structure 100M may be embedded in the dielectric layer 13 of the interconnect structure 34 and electrically connected to the interconnect circuitries 14 of the interconnect structure 34. In some embodiments, the memory cell structure 100M is electrically coupled to the transistor 110 through the interconnect structure 34. The transistor 110 and the memory cell structure 100M may be collectively referred to as a memory device, where the transistor 110 may act as a selective transistor for the memory device. The details of the memory cell structure 100M is not shown in FIG. 2A for simplicity. The memory device may be or may include Resistive Random Access Memory (RRAM) device, Dynamic Random Access Memory (DRAM) device, Static Random Access Memory (SRAM) device, Magnetoresistive Random Access Memory (MRAM), or the like. Alternatively, the memory cell structure 100M is omitted or may be replaced with other types of electrical device, and thus the memory cell structure 100M in FIG. 2A is illustrated in dashed lines to indicate it may be (or may not be) present in the interconnect structure 34.

Still referring to FIG. 2A, the semiconductor structure 10A may include a contact pad 15 (e.g., aluminum pad) formed on the topmost one of the interconnect circuitries 14. In some embodiments, the semiconductor structure 10A includes a passivation layer 16 formed on the top of the dielectric layer 13 and partially covering the contact pad 15. For example, the passivation layer 16 includes one or more layers of silicon oxide, silicon nitride, silicon oxynitride, the like, or a combination thereof. In some embodiments, the semiconductor structure 10A includes a conductive terminal 17 landing on the contact pad 15 for further electrical connection. For example, a bottom portion 17A of the conductive terminal 17, such as a conductive pillar formed of a metal (e.g., copper) or a metal alloy, extends through the passivation layer 16 to be in contact with the contact pad 15. The conductive terminal 17 optionally includes a cap portion 17B disposed on the bottom portion 17A and including a different material (e.g., solder material) than the underlying bottom portion 17A.

In some embodiments, the semiconductor structure 10A is implemented as an integrated circuit die such as a logic die (e.g., central processing unit (CPU), graphics processing unit (GPU), system-on-a-chip (SoC), application processor (AP), microcontroller, etc.), a memory die (e.g., DRAM die, SRAM die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, or combinations thereof. In some embodiments, the semiconductor structure 10A is a part of an interposer, a part of an integrated circuit package, etc.

Referring to FIG. 2B and with reference to FIG. 2A, a semiconductor structure 10B is similar to the semiconductor structure 10A illustrated in FIG. 2A, with similar features being labeled with similar numerical references, and the descriptions of the similar features are not repeated herein. In some embodiments, the difference between the semiconductor structures 10A and 10B lies in that the semiconductor substrate 11 is free of active/passive device (e.g., the device 12 in FIG. 2A). The semiconductor structure 10B may be free of FEOL device formed within the semiconductor substrate 11. The transistor 110 formed over the first surface 11a of the semiconductor substrate 11 may directly serve as a first layer of device in the semiconductor structure 10B. The routing (e.g., 1411, 1412, and 142) between the device 12 and the transistor 110 shown in FIG. 2A may be omitted. Again, the configuration shown in FIG. 2B is merely an example and is not intended to be limited to the details recited herein. The semiconductor structure 10B may be used in a wide variety of applications, and each of these applications is intended to be included within the scope of the embodiments presented.

FIGS. 3A-3E are cross-sectional views illustrating various stages of a manufacturing method of a transistor according to some embodiments. Unless specified otherwise, the materials and the formation methods of the components in these embodiments are essentially the same as the like components, which are denoted by like reference numerals in the embodiments shown in FIGS. 1A-1C. The details regarding the formation process and the materials of the components shown in FIGS. 3A-3E may thus be found in the discussion of the embodiments shown in FIGS. 1A-1C.

Figure 3A:
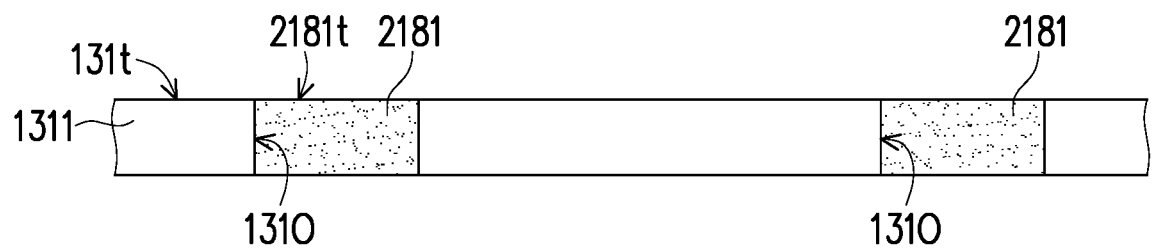
FIGS. 3A-3E are cross-sectional views illustrating various stages of a manufacturing method of a transistor according to some embodiments.

Referring to FIG. 3A, bottom electrodes 2181 may be formed in the dielectric material 1311. The material of the dielectric material 1311 is the same as or similar to that of the dielectric sublayer 131 described in FIG. 1A. The material of the bottom electrodes 2181 may be the same as or similar to that of the source/drain electrodes 118 as described in FIG. 1C. For example, the bottom electrodes 2181 include conductive metal oxide material(s) such as IGZO, InWO, InZnO, InSnO, ZnO, GaOx, InOx, AZO, combinations thereof, and/or the like. In some embodiments, the bottom electrodes 2181 may include a conducting oxide material having the free electron concentration of substantially equal to or greater than about $10^{18}$ cm$^{-3}$.

The bottom electrodes 2181 may be formed by suitable fabrication techniques. For example, the dielectric material 1311 is formed by depositing a layer of dielectric and removing a portion of the layer of dielectric to form the dielectric material 1311 with the openings 131O by the photolithography and etching processes or any suitable patterning process. Subsequently, the metal oxide semiconductor material may be formed over the dielectric material 1311 and in the openings 131O by any suitable deposition process (e.g., CVD, PVD, ALD, or the like). The metal oxide semiconductor material may be doped during or after the deposition process, where the metal oxide material may be heavily doped (with metal ions) with the electron concentration of at least $10^{18}$ cm$^{-3}$. Thereafter, the planarization (e.g., CMP, mechanical grinding, etching, a combination thereof, or the like) may be performed on the conductive metal oxide material until the dielectric material 1311 is accessibly exposed to form the bottom electrodes 2181. In some embodiments, after the planarization process, top surfaces 2181t of the bottom electrodes 2181 are substantially leveled (e.g., coplanar) with the top surface 131t of the dielectric material 1311, within process variations.

Figure 3B:
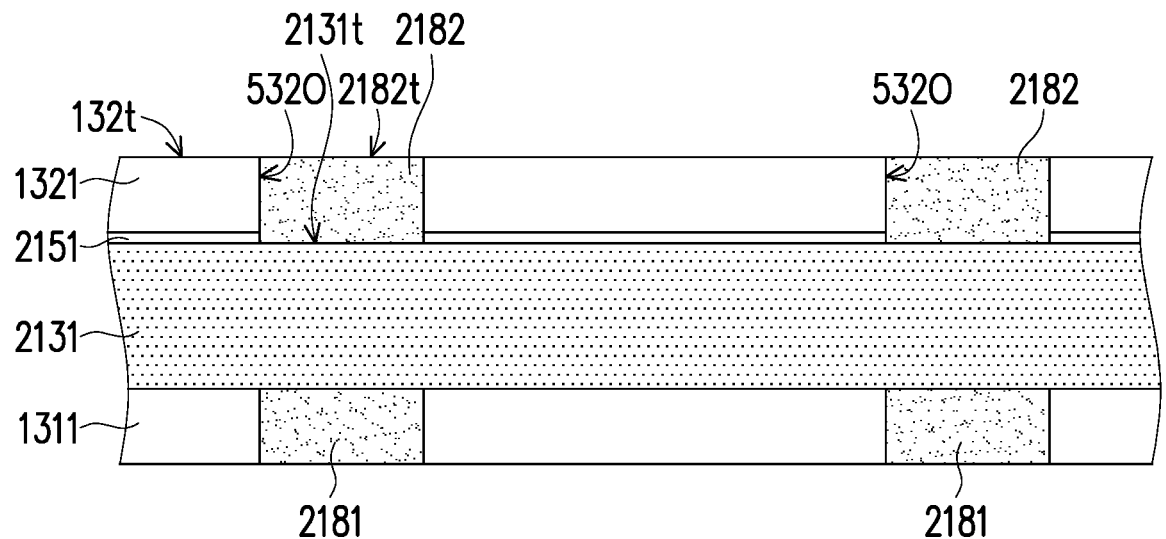

Referring to FIG. 3B and with reference to FIG. 3A, a spacer material 2131 may be formed on the bottom electrodes 2181 and the dielectric material 1311. The dielectric material 1321 may be formed on the spacer material 2131, and top electrodes 2182 may be formed in the dielectric material 1321 over the bottom electrodes 2181. An etch stop material 2151 is optionally formed between the spacer material 2131 and the dielectric material 1321. In some embodiments, each of the top electrodes 2182 is right above and overlaps one of the bottom electrodes 2181. For example, the distribution of the top electrodes 2182 substantially matches that of the bottom electrodes 2181 in a top-down view (not shown). In some embodiments, the spacer material 2131 may be made of (or include) a dielectric material (e.g., silicon nitride, silicon oxynitride, silicon oxide, silicon carbide, one or more other suitable materials, and/or a combination thereof). In some embodiments, the spacer material 2131 is a part of the ILD layer. The material of the dielectric material 1321 may be similar to that of the dielectric sublayer 132 described in FIG. 1C. The etch stop material 2151 may have a material different from the overlying dielectric material 1321, and may be made of (or include) silicon nitride, silicon oxynitride, silicon carbide, one or more other suitable materials, or a combination thereof. The top electrodes 2182 may include conductive metal oxide material(s) and may be the same as or similar to the material of the bottom electrodes 2181.

In some embodiments, layers of the spacer material, the etch stop material, and dielectric material are sequentially formed by any suitable deposition process (e.g., PVD, CVD, ALD, and/or the like), where the spacer material 2131 is formed on the top surface 131t of the dielectric material 1311 and the top surface 2181t of the bottom electrodes 2181. Alternatively, the etch stop material may be omitted. Next, a portion of the spacer material, the etch stop material (if any), and dielectric material may be removed by the photolithography and etching processes or any suitable patterning process to form the etch stop material 2151 and the dielectric material 1321. For example, openings 5320 may be formed in the dielectric material and the underlying etch stop material (if any) to accessibly expose at least a portion of the top surface 2131t of the spacer material 2131. Subsequently, the conducting oxide material may be formed over the dielectric material 1321 and in the openings 5320 by any suitable deposition process (e.g., CVD, PVD, ALD, or the like). The conducting oxide material may be heavily doped (with metal ions) with the electron concentration of at least $10^{18}$ cm$^{-3}$ during or after the deposition process. Thereafter, the planarization (e.g., CMP, mechanical grinding, etching, a combination thereof, or the like) may be performed on the conducting oxide material until the dielectric material 1321 is accessibly exposed to form the top electrodes 2182. In some embodiments, after the planarization process, top surfaces 2182t of the top electrodes 2182 are substantially leveled (e.g., coplanar) with the top surface 132t of the dielectric material 1321, within process variations.

Figure 3C:
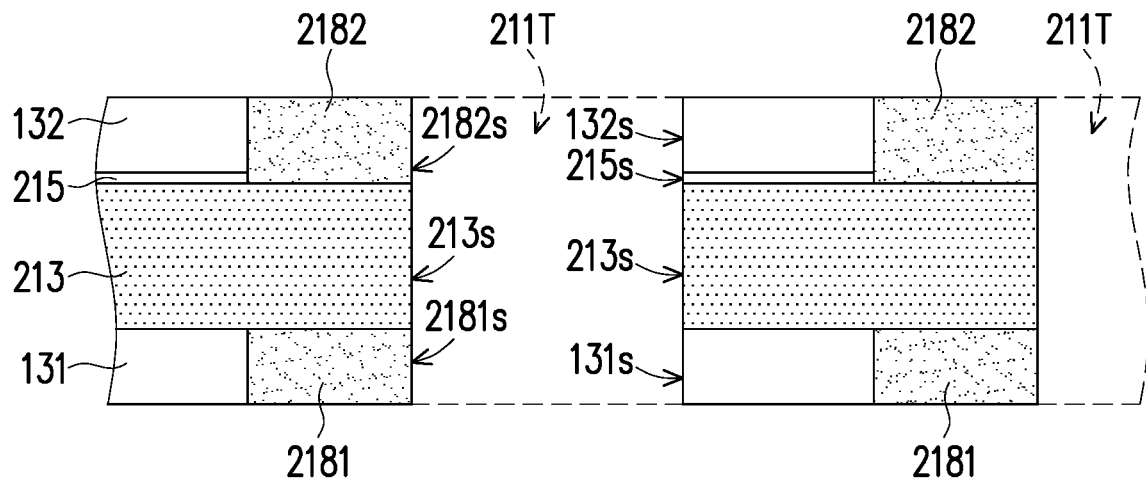

Referring to FIG. 3C and with reference to FIG. 3B, trenches 211T may be formed to extend through the dielectric material 1321, the etch stop material 2151 (if any), the spacer material 2131, and the dielectric material 1311 so as to respectively form the dielectric sublayer 132, the etch stop layer 215, the spacer layer 213, and the dielectric sublayer 131. For example, the trenches 211T are formed through the photolithography and etching process. For example, the dry etch process is employed. Alternatively, the wet etch process may be performed alone or in a combination with the dry etch process. The trenches 211T may accessibly expose sidewalls of layers after the etching. For example, corresponding to one side of the respective trench 211T, the sidewall 2182s of the top electrode 2182 may be substantially aligned (or leveled) with the sidewall 213s of the spacer layer 213 and the sidewall 2181s of the bottom electrode 2181. In some embodiments, the respective top electrode 2182 may have only one sidewall 2182s accessibly exposed by the corresponding trench 211T, and the rest of the sidewalls of the respective top electrode 2182 remains covered by the dielectric sublayer 132. Similarly, the respective bottom electrode 2181 may have only one sidewall 2181s accessibly exposed by the corresponding trench 211T, and the rest of the sidewalls of the respective bottom electrode 2181 remains covered by the dielectric sublayer 131. For example, corresponding to the opposing side of the respective trench 211T, the sidewall 132s of the dielectric sublayer 132 and the sidewall 215s of the etch stop layer 215 may be substantially aligned (or leveled) with the sidewall 213s of the spacer layer 213 and the sidewall 131s of the dielectric sublayer 131.

Figure 3D:
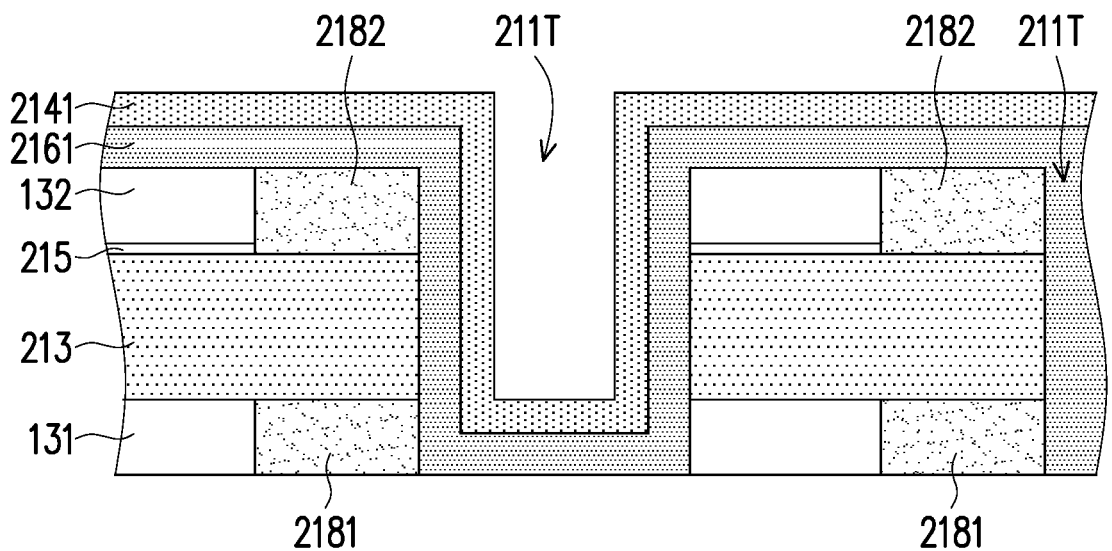

Referring to FIG. 3D and with reference to FIG. 3C, an active material layer 2161 may be formed on the top electrodes 2182 and the dielectric sublayer 132 and also formed in the trenches 211T, and a gate dielectric material layer 2141 may be formed on the active material layer 2161. For example, the active material layer 2161 may include a metal oxide material with the free electron concentration less than about $10^{18}$ cm$^{-3}$. The material of the active material layer 2161 and the material of the gate dielectric material layer 2141 may be respectively similar to those of the active layer 116 and the gate dielectric layer 114 described in FIG. 1B. The active material layer 2161 and the gate dielectric material layer 2141 may be formed by any suitable deposition process (e.g., ALD, PVD, CVD, and/or the like). In some embodiments, the active material layer 2161 is formed directly on the top surfaces 2182t and 132t (labeled in FIG. 3B) of the dielectric sublayer 132 and the top electrodes 2182 and extends to cover the sidewalls (2182s, 213s, 2181s, 132s, 215s, and 131s) that define the respective trench 211T. The active material layer 2161 may be formed in a conformal manner such that the active material layer 2161 partially fills the respective trench 211T. Subsequently, the gate dielectric material layer 2141 may be blanketly formed on the active material layer 2161 and partially fill the respective trench 211T.

Figure 3E:
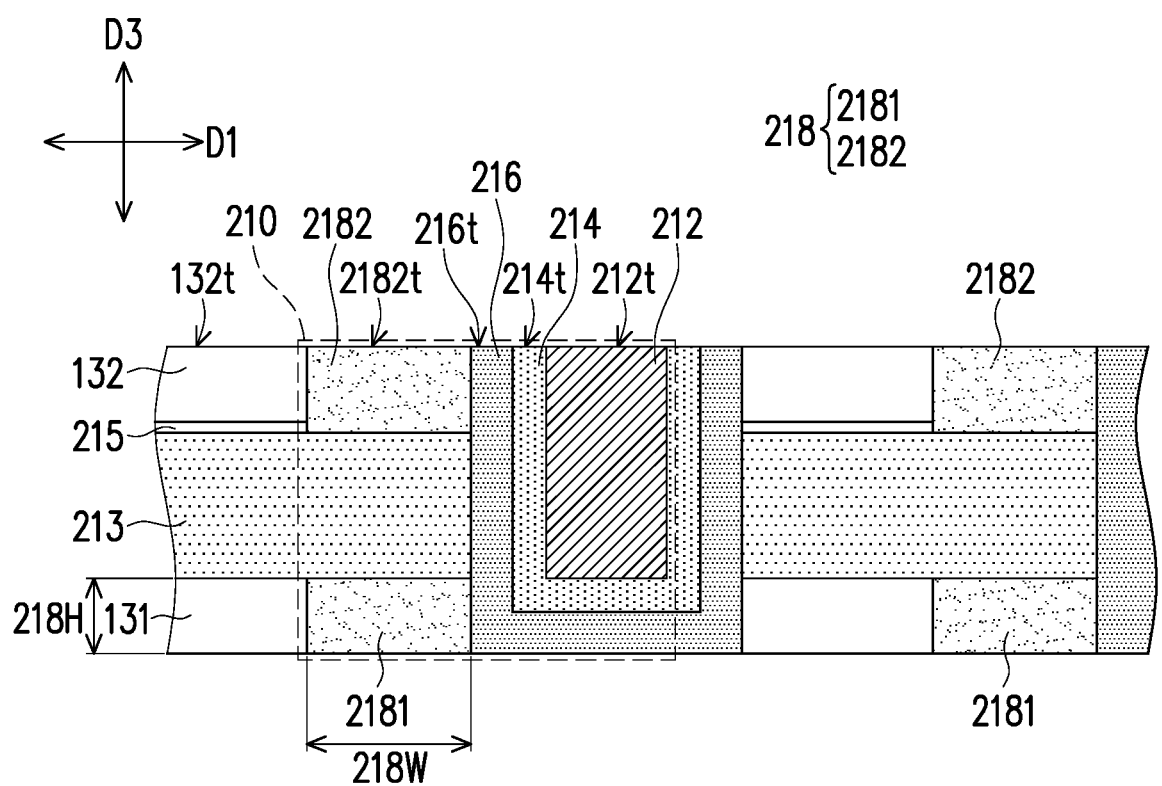

Referring to FIG. 3E and with reference to FIG. 3D, a gate material layer may be formed on the gate dielectric material layer 2141 and fill the trenches 211T, and then portions of the gate material layer, the underlying gate dielectric material layer 2141, and the underlying active material layer 2161 may be removed to respectively form a gate electrode 212, a gate dielectric layer 214, and an active layer 216. The gate material layer may be similar to the material of the gate electrode 112 described in FIG. 1A and may be formed by any suitable deposition process (e.g., plating or the like). In some embodiments, the planarization process (e.g., CMP, mechanical grinding, etching, a combination thereof, or the like) may be performed after deposition of the gate material layer for removal excess materials until the top electrodes 2182 are accessibly revealed. For example, after the planarization process, the top surfaces 2182t of the top electrodes 2182 and the top surface 132t of the dielectric sublayer 132 are substantially leveled (e.g., coplanar) with a top surface 216t of the active layer 216, a top surface 214t of the gate dielectric layer 214, and a top surface 212t of the gate electrode 212, within process variations.

As shown in FIG. 3E, a transistor 210 is provided. The transistor 210 may be referred to as a vertical TFT, given its arrangement. For example, the bottom electrode 2181, the spacer layer 213, and the top electrode 2182 are sequentially stacked in the third direction D3. The top electrode 2182 and the bottom electrode 2181 right below the top electrode 2182 may act as the source/drain electrodes 218 of the transistor 210. The spacer layer 213 is interposed between the top electrode 2182 and the bottom electrode 2181 for isolation. In some embodiments, the dimensions of the source/drain electrodes 218 may shrink down to submicron range. For example, a lateral dimension 218W (e.g., the top width or the bottom width) of the respective source/drain electrode 218 is about 30 nm±10%. A thickness 218H of the respective source/drain electrode 218 may be less than about 100 nm and greater than about 5 nm.

In some embodiments, the active layer 216 extends along sidewalls of the stack of the bottom electrode 2181, the spacer layer 213, and the top electrode 2182, where the top and bottom surfaces of the active layer 216 may be substantially leveled with the top surface 2182t of the top electrode 2182 and the bottom surface of the bottom electrode 2181, respectively. The active layer 216, the gate dielectric layer 214 laterally covering the active layer 216, and the gate electrode 212 laterally covering the gate dielectric layer 214 may be sequentially arranged in the first direction D1. For example, in a side view (not shown), the gate electrode 212 may completely overlap the top electrode 2182 and may at least partially (or fully) overlap the bottom electrode 2181. In some embodiments, both of the gate dielectric layer 214 and the active layer 216 include an L-shape cross section. For example, the gate electrode 212 may include a sidewall and a bottom surface that are directly covered by the gate dielectric layer 214. The gate dielectric layer 214 may include a sidewall and a bottom surface that are directly covered by the active layer 216.

Figure 4A:
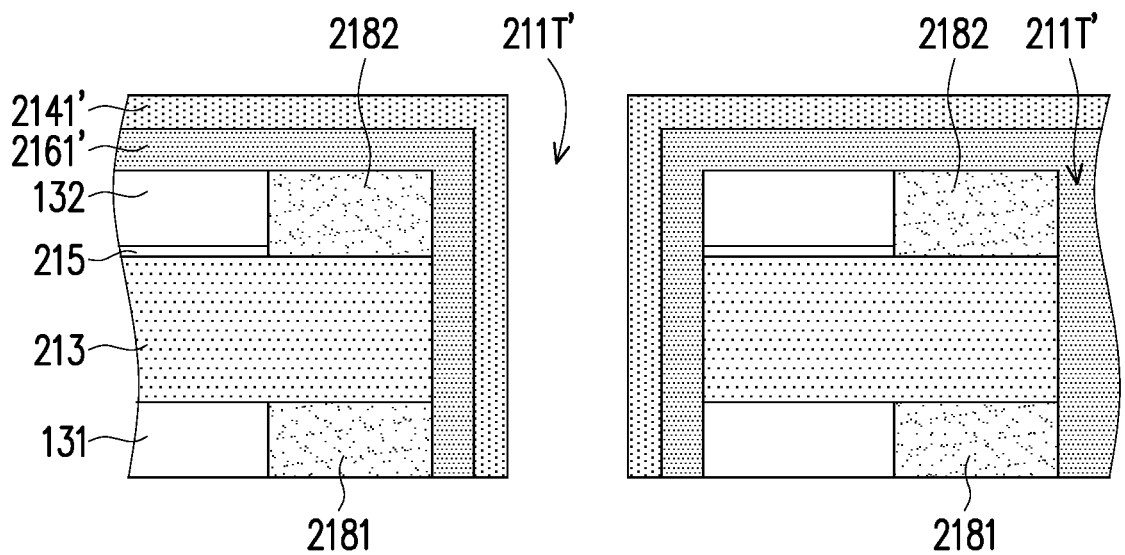
FIGS. 4A and 4B are cross-sectional views illustrating various stages of a manufacturing method of a transistor according to some embodiments.
Figure 4B:
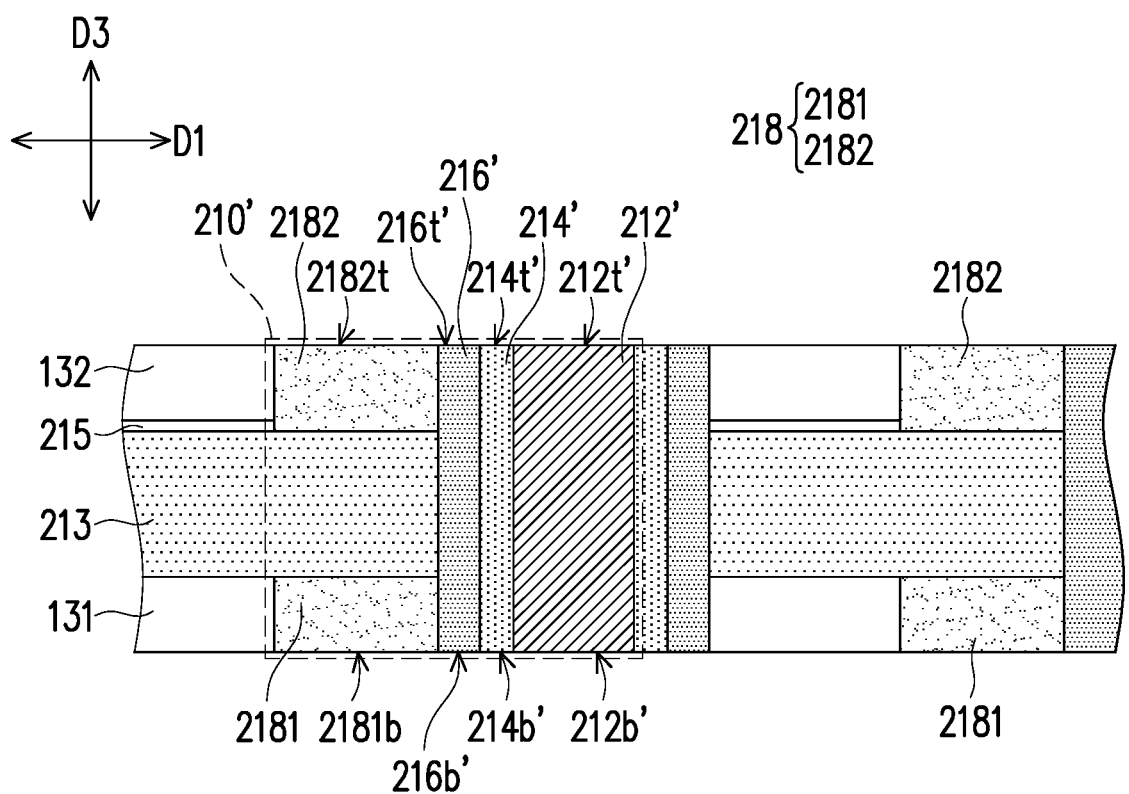

FIGS. 4A and 4B are cross-sectional views illustrating various stages of a manufacturing method of a transistor according to some embodiments. Unless specified otherwise, the materials and the formation methods of the components in these embodiments are essentially the same as the like components, which are denoted by like reference numerals in the embodiments shown in FIGS. 3A-3E. The details regarding the formation process and the materials of the components shown in FIGS. 4A-4B may thus be found in the discussion of the embodiments shown in FIGS. 3A-3E.

Referring to FIG. 4A, the structure is similar to the structure shown in FIG. 3D, except for the active material layer 2161' and the overlying gate dielectric material layer 2141'. For example, the active material layer 2161' and the overlying gate dielectric material layer 2141' accessibly expose the bottom end of the trench 211T'. In some embodiments, after deposition of the active material layer and the gate dielectric material layer as described in FIG. 3D, an etching process may be performed to remove a bottom portion of the gate dielectric material layer and an underlying portion of the active material layer to respectively form the gate dielectric material layer 2141' and the active material layer 2161'. The sidewalls of the bottom electrodes 2181 may remain covered by the stack of the active material layer 2161' and the gate dielectric material layer 2141'.

Referring to FIG. 4B and with reference to FIG. 4A, the gate material layer may be formed on the gate dielectric material layer 2141' and fill the trench 211T', and then portions of the gate material layer, the underlying gate dielectric material layer 2141', and the underlying active material layer 2161' may be removed to respectively form a gate electrode 212', a gate dielectric layer 214', and an active layer 216'. The gate material layer may be similar to the material of the gate electrode 112 described in FIG. 1A and may be formed by any suitable deposition process (e.g., plating or the like). The planarization process (e.g., CMP, mechanical grinding, etching, a combination thereof, or the like) may be performed after deposition of the gate material layer for removal excess materials until the top electrodes 2182 are accessibly revealed. Afterwards, a transistor 210' is provided.

The transistor 210' includes the gate electrode 212' elongated in the third direction D3 and laterally covered by the gate dielectric layer 214'. For example, the top surfaces 2182t of the top electrodes 2182 is substantially leveled (e.g., coplanar) with a top surface 216t' of the active layer 216', a top surface 214t' of the gate dielectric layer 214', and a top surface 212t' of the gate electrode 212', within process variations. A bottom surface 2181b of the bottom electrode 2181 may be substantially leveled (e.g., coplanar) with a bottom surface 216b' of the active layer 216, a bottom surface 214b' of the gate dielectric layer 214', and a bottom surface 212b' of the gate electrode 212', within process variations.

Figure 5A:
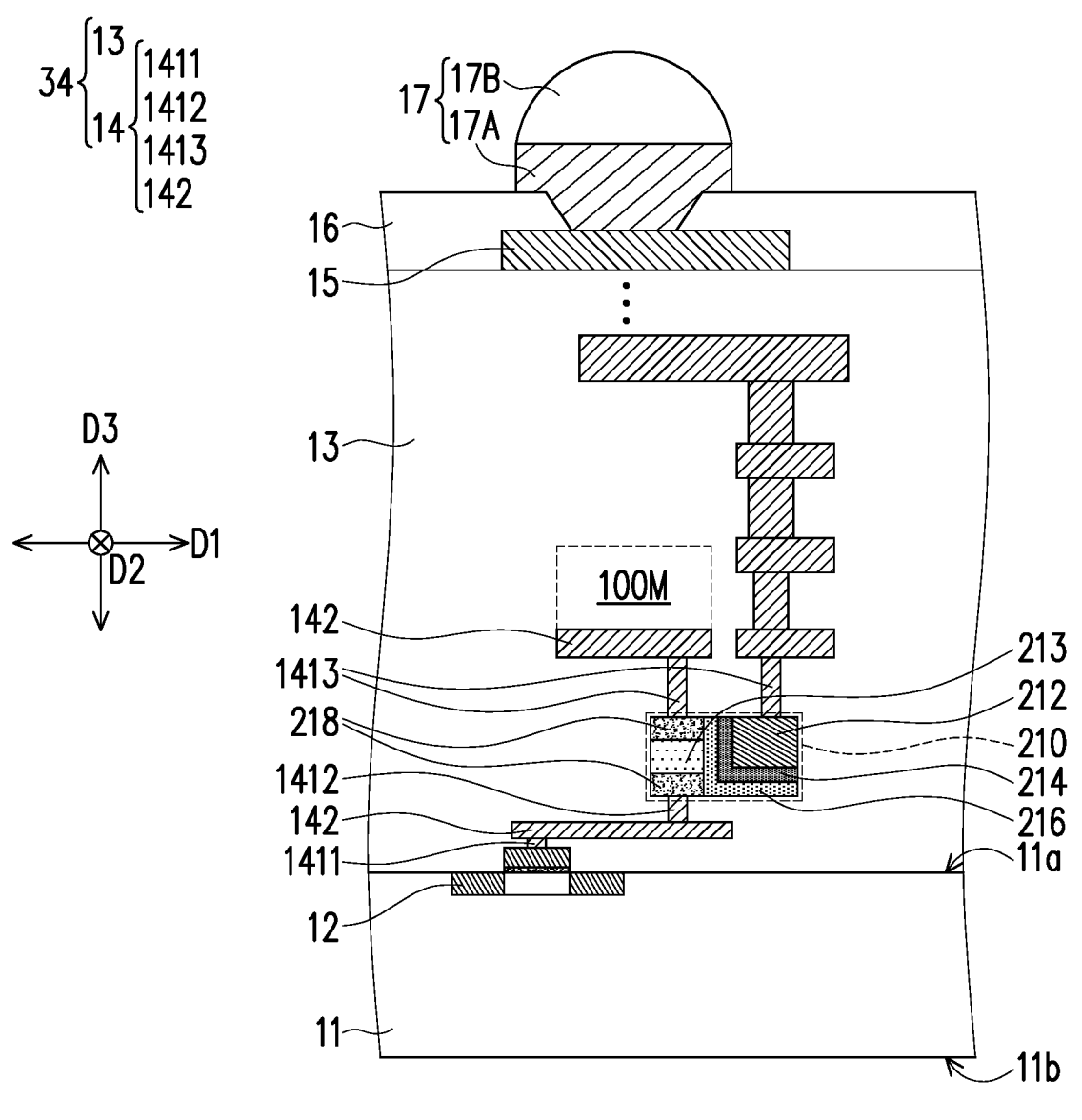
FIGS. 5A and 5B are cross-sectional views illustrating a semiconductor structure including the transistor in FIG. 3E according to some embodiments.
Figure 5B:
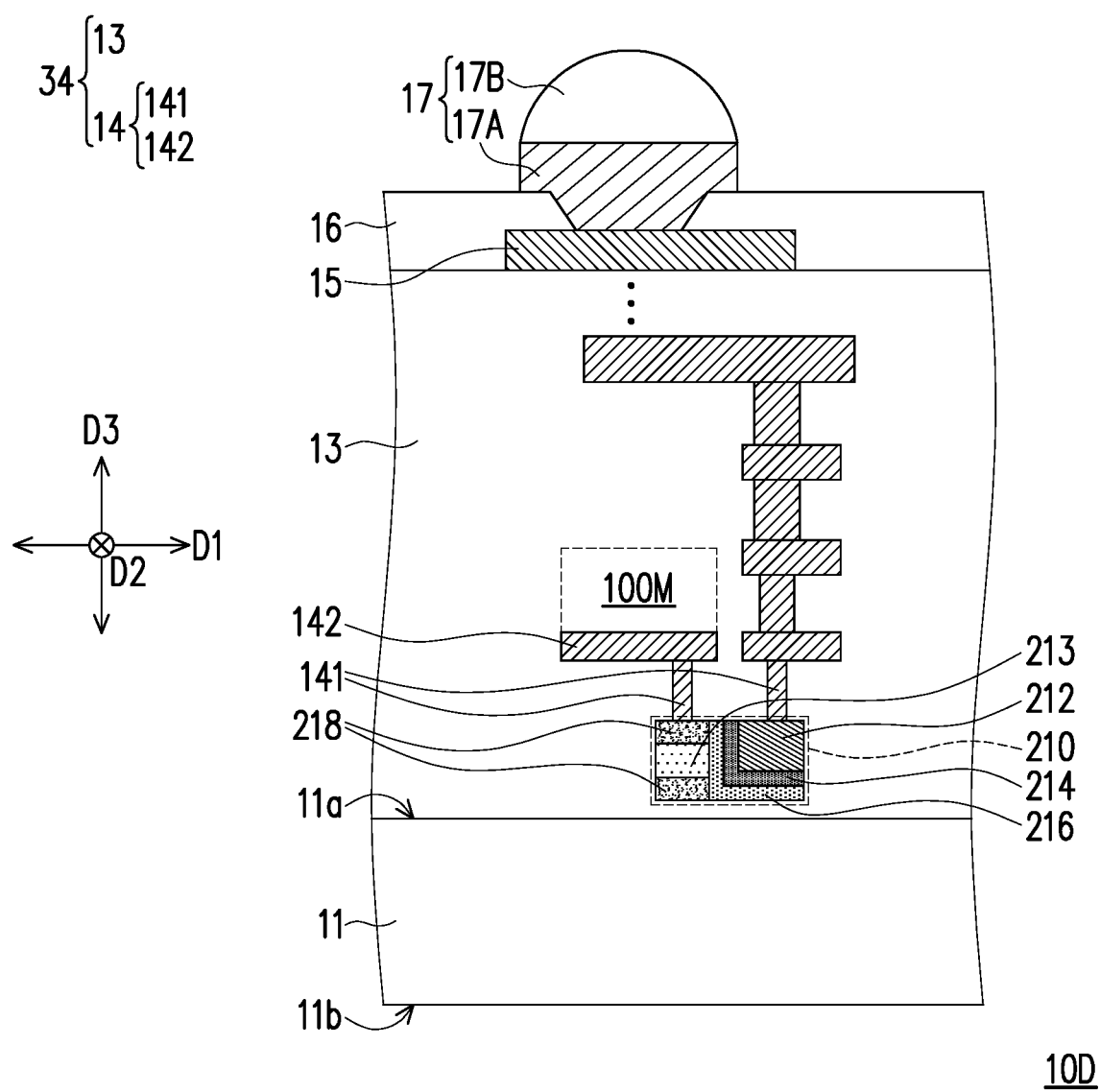

FIGS. 5A and 5B are cross-sectional views illustrating a semiconductor structure including the transistor 210 in FIG. 3E according to some embodiments. Unless specified otherwise, the materials and the formation methods of the components in these embodiments are essentially the same as the like components, which are denoted by like reference numerals in the embodiments shown in FIGS. 3A-3E. It should be appreciated that the transistor 210 illustrated in FIGS. 5A-5B may be replaced with the transistor 210' shown in FIG. 4B, in accordance with some embodiments.

Referring to FIG. 5A and with reference to FIG. 3E and FIG. 2A, a semiconductor structure 10C is similar to the semiconductor structure 10A described in FIG. 2A, except for the transistor 210. The transistor 210 in the semiconductor structure 10C may be the same as the transistor 210 described in FIG. 3E. The same/similar elements are denoted by the same/similar reference numerals, and the detailed descriptions thereof are omitted herein. The transistor 210 of the semiconductor structure 10C may be embedded in the dielectric layer 13 and electrically coupled to the interconnect circuitries 14. The transistor 210 may be referred to as the vertical transistor, where the source/drain electrodes 218, the active layer 216, the gate dielectric layer 214, and the gate electrode 212 may be arranged in the first direction D1. The gate electrode 212 may be elongated along the third direction D3 (e.g., the thickness direction of the semiconductor structure 10C) that is substantially perpendicular to the first direction D1.

In some embodiments, the transistor 210 of the semiconductor structure 10C is disposed in the interconnect structure 34 and may be electrically coupled to the device 12 through the interconnect circuitries 14 (such as 1411, 142, and 1412). In some embodiments, the transistor 210 of the semiconductor structure 10C may be electrically coupled to an external device (not shown) through the interconnect circuitries 14, the contact pad 15, and the conductive terminal 17. For example, the conductive vias 1413 at a same level may respectively land on top surfaces of the gate electrode 212 and the top electrode 2182 (labeled in FIG. 3E). In some embodiments, the transistor 210 may be electrically coupled to the memory cell structure 100M through the interconnect circuitries 14 (such as 1413 and 142). The transistor 210 and the memory cell structure 100M may be collectively referred to as a memory device, where the transistor 210 may act as a selector for the memory device. Alternatively, the memory cell structure 100M may be omitted or may be replaced with other type of BEOL devices.

Referring to FIG. 5B and with reference to FIG. 5A and FIG. 2B, a semiconductor structure 10D is similar to the semiconductor structure 10C illustrated in FIG. 5A and also similar to the semiconductor structure 10B illustrated in FIG. 2B, with similar features being labeled with similar numerical references, and the descriptions of the similar features are not repeated herein. The difference between the semiconductor structures 10D and 10C lies in that the semiconductor substrate 11 of the semiconductor structure 10D is free of active/passive device (e.g., the device 12 in FIG. 5A). On the other hand, the difference between the semiconductor structures 10D and 10B lies in that the transistor 210 in the semiconductor structure 10D is a vertical transistor, while the transistor 110 in the semiconductor structure 10B is a planar transistor.

FIGS. 6A-6E are cross-sectional views illustrating various stages of a manufacturing method of a transistor according to some embodiments. Unless specified otherwise, the materials and the formation methods of the components in these embodiments are essentially the same as the like components, which are denoted by like reference numerals in the embodiments shown in FIGS. 3A-3E. The details regarding the formation process and the materials of the components shown in FIGS. 6A-6E may thus be found in the discussion of the embodiments shown in FIGS. 3A-3E.

Figure 6A:
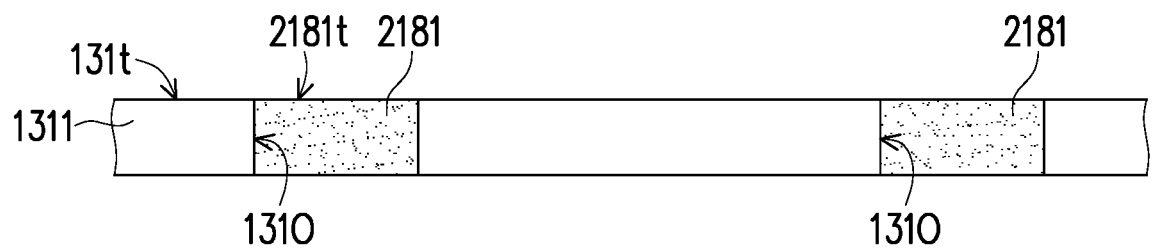
FIGS. 6A-6E are cross-sectional views illustrating various stages of a manufacturing method of a transistor according to some embodiments.

Referring to FIG. 6A, the bottom electrodes 2181 may be formed in the dielectric material 1311. The materials and the formation process of the dielectric material 1311 and the bottom electrodes 2181 may be similar to those of the dielectric material 1311 and the bottom electrodes 2181 described in FIG. 3A. The bottom electrodes 2181 may include a conducting oxide material having the free electron concentration of greater than (or substantially equal to) about $10^{18}$ cm$^{-3}$. The top surfaces 2181t of the bottom electrodes 2181 may be substantially leveled (e.g., coplanar) with the top surface 131t of the dielectric material 1311, within process variations.

Figure 6B:
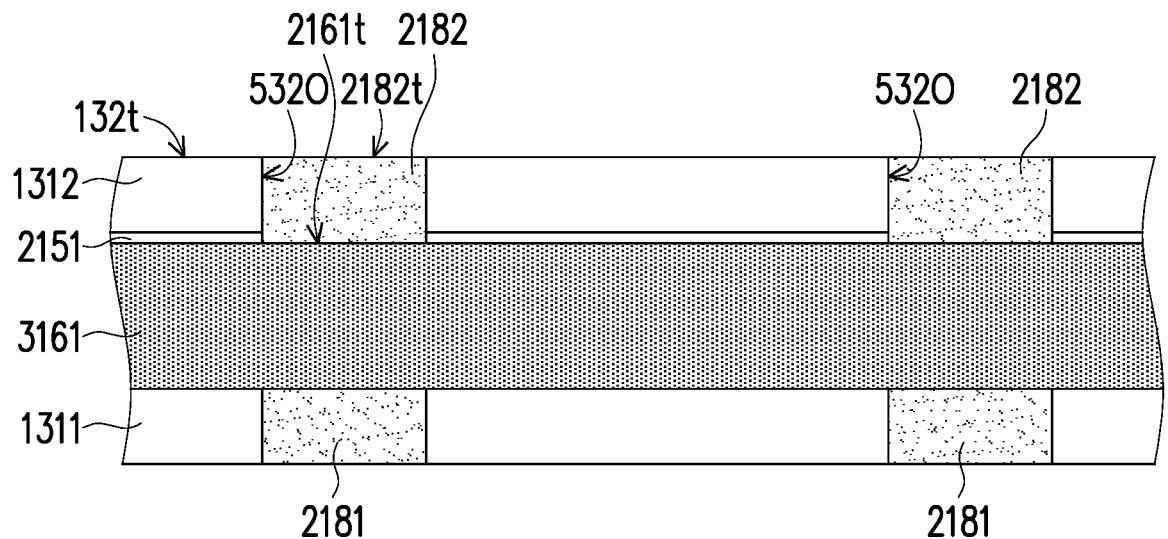

Referring to FIG. 6B and with reference to FIG. 6A, an active material layer 3161 may be formed on the top surfaces (131t and 2181t) of the dielectric material 1311 and the bottom electrodes 2181. The active material layer 3161 may be similar to the active material layer 2161 described in FIG. 3D and may be formed by any suitable deposition process (e.g., ALD, PVD, CVD, and/or the like). For example, the active material layer 3161 may include a metal oxide material with a doping concentration less than about $10^{18}$ cm$^{-3}$. In some embodiments, layers of etch stop material and the dielectric material may be sequentially formed on a top surface 3161t of the active material layer 3161 by any suitable deposition process (e.g., ALD, PVD, CVD, and/or the like). Alternatively, the etch stop material may be omitted. Next, a portion of the dielectric material and the underlying etch stop material may be removed by the photolithography and etching processes or any suitable patterning process to form the dielectric material 1321 and the etch stop material 2151. For example, the openings 5320 may be formed in the dielectric material and the underlying etch stop material (if any) to accessibly expose at least a portion of the top surface 3161t of the active material layer 3161.

Subsequently, the conducting oxide material may be formed over the dielectric material 1321 and in the openings 5320 to be directly on the top surface 3161t of the active material layer 3161 by any suitable deposition process (e.g., CVD, PVD, ALD, or the like). The conducting oxide material may be heavily doped (with metal ions) with the electron concentration of at least about $10^{18}$ cm$^{-3}$. Thereafter, the planarization process (e.g., CMP, mechanical grinding, etching, a combination thereof, or the like) may be performed on the conducting oxide material until the dielectric material 1321 is accessibly exposed to form the top electrodes 2182. After the planarization process, the top surfaces 2182t of the top electrodes 2182 may be substantially leveled (e.g., coplanar) with the top surface 132t of the dielectric material 1321, within process variations.

Figure 6C:
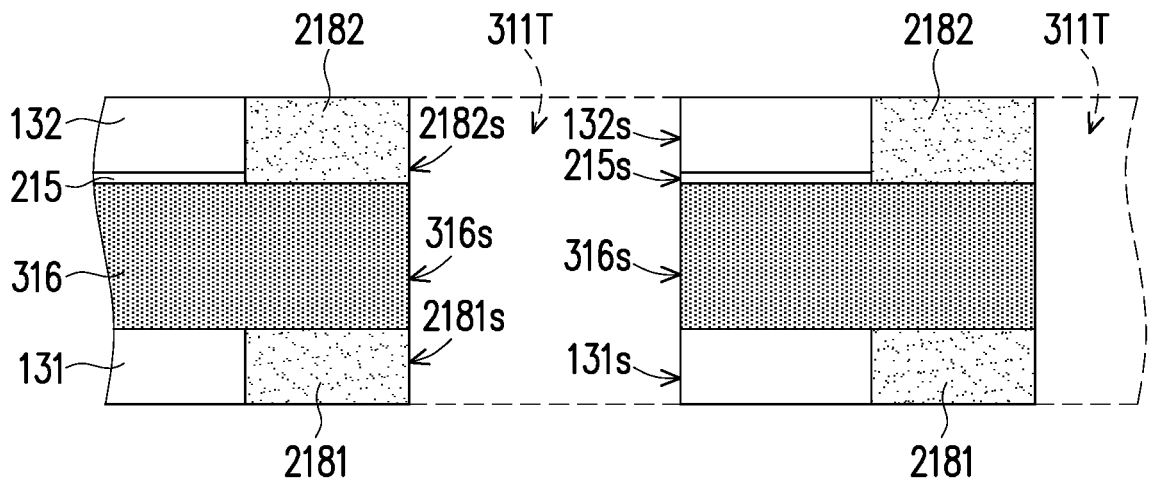

Referring to FIG. 6C and with reference to FIG. 6B, trenches 311T may be formed to extend through the dielectric material 1321, the etch stop material 2151, the active material layer 3161, and the dielectric material 1311 so as to respectively form the dielectric sublayer 132, the etch stop layer 215, the active layer 316, and the dielectric sublayer 131. For example, the trenches 311T are formed through the photolithography and etching process. In some embodiments, the dry etch process is employed. Alternatively, the wet etch process may be performed alone or in a combination with the dry etch process. The trenches 311T may accessibly expose sidewalls of layers. For example, corresponding to one side of the respective trench 311T, the sidewall 2182s of the top electrode 2182 may be substantially aligned (or leveled) with a sidewall 316s of the active layer 316 and the sidewall 2181s of the bottom electrode 2181, within process variations. On the other hand, corresponding to the opposing side of the respective trench 311T, the sidewall 132s of the dielectric sublayer 132 and the sidewall 215s of the etch stop layer 215 may be substantially aligned (or leveled) with the sidewall 316s of the active layer 316 and the sidewall 131s of the dielectric sublayer 131, within process variations.

Figure 6D:
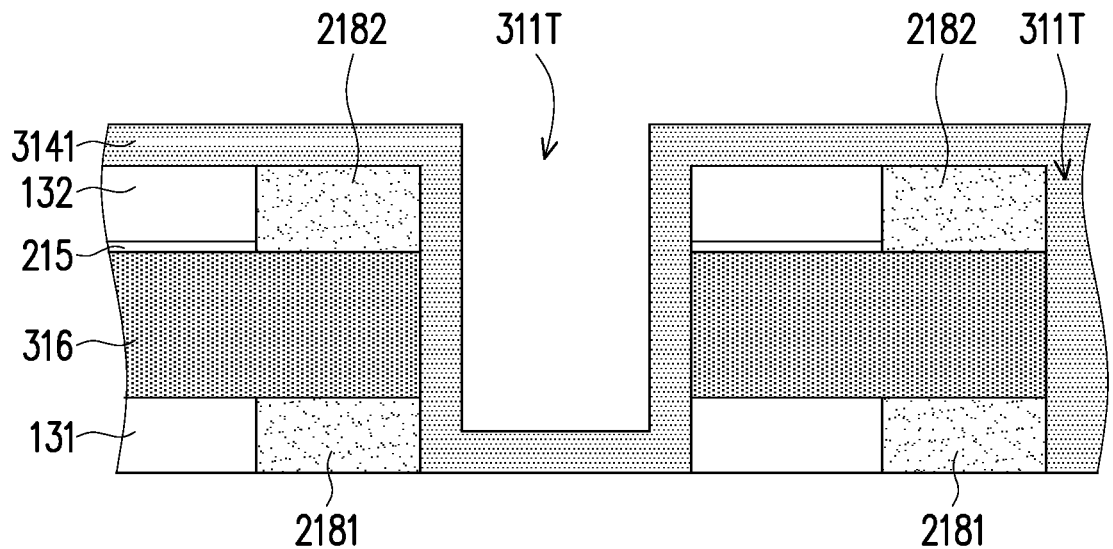

Referring to FIG. 6D and with reference to FIG. 6C, a gate dielectric material layer 3141 may be formed on the top electrodes 2182 and the dielectric sublayer 132 and may be formed in the trenches 311T. The gate dielectric material layer 3141 may be similar to the gate dielectric material layer 2141 described in FIG. 3D. In some embodiments, the gate dielectric material layer 3141 is formed directly on the top surfaces 2182t and 132t (labeled in FIG. 6B) of the dielectric sublayer 132 and the top electrodes 2182 and extends to cover the sidewalls (2182s, 316s, 2181s, 132s, 215s, and 131s) that define the respective trench 311T. The gate dielectric material layer 3141 may be formed in a conformal manner such that the gate dielectric material layer 3141 partially fills the respective trench 311T.

Figure 6E:
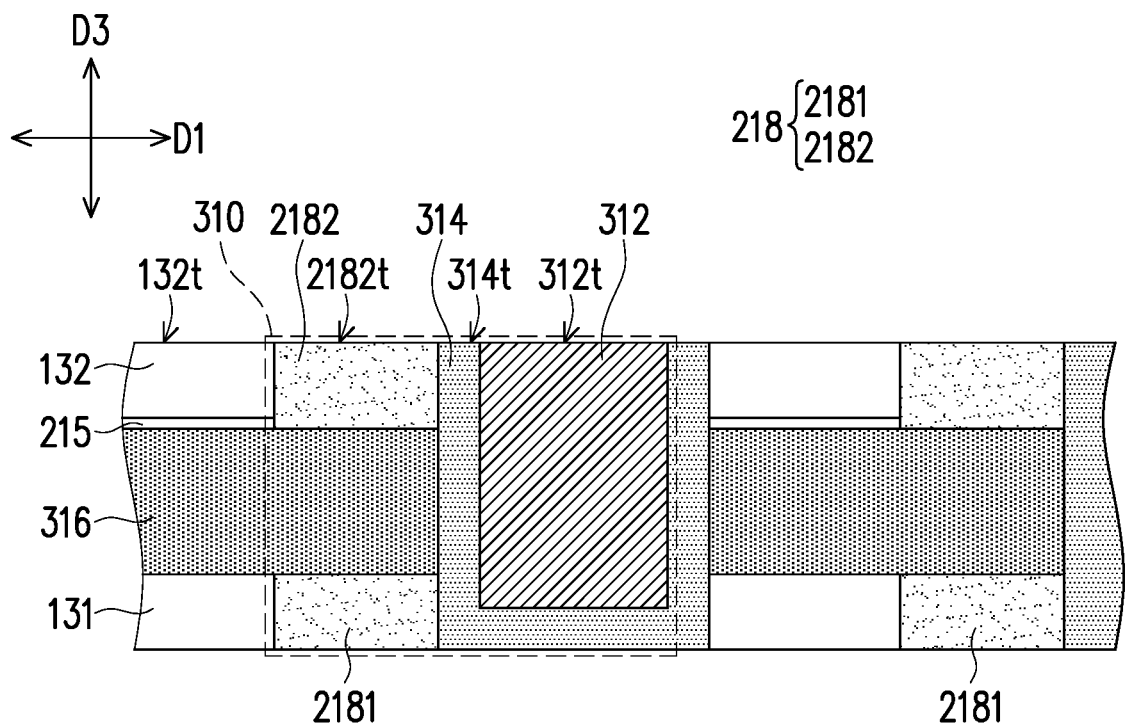

Referring to FIG. 6E and with reference to FIG. 6D, the gate material layer may be formed on the gate dielectric material layer 3141 and fill the trenches 311T, and then excess portions of the gate material layer and the underlying gate dielectric material layer 3141 may be removed to respectively form a gate electrode 312 and a gate dielectric layer 314. The gate material layer may be similar to the material of the gate electrode 112 described in FIG. 1A and may be formed by any suitable deposition process such as plating or the like. In some embodiments, the planarization process (e.g., CMP, mechanical grinding, etching, a combination thereof, or the like) may be performed, and thus excess materials are removed until the top electrodes 2182 are accessibly revealed. For example, after the planarization process, the top surfaces 2182t of the top electrodes 2182 and the top surface 132t of the dielectric sublayer 132 are substantially leveled (e.g., coplanar) with a top surface 314t of the gate dielectric layer 314 and a top surface 312t of the gate electrode 312, within process variations.

As shown in FIG. 6E, a transistor 310 is provided. The transistor 310 may be referred to as a vertical TFT, given its arrangement. For example, the bottom electrode 2181, the active layer 316, and the top electrode 2182 are sequentially stacked in the third direction D3. In some embodiments, the bottom electrode 2181, the active layer 316, and the top electrode 2182 may be elongated in the first direction D1 that is substantially perpendicular to the third direction D3. Alternatively, the bottom electrode 2181 and the top electrode 2182 may have substantially square cross sections. The top electrode 2182 and the bottom electrode 2181 that is directly below the top electrode 2182 may act as the source/drain electrodes 218. In some embodiments, the active layer 316 includes a top surface 316t covered by the top electrode 2182, a bottom surface 316b covered by the bottom electrode, and a sidewall 316s covered by the gate dielectric layer 314. The gate dielectric layer 314 and the gate electrode 312 laterally covering the gate dielectric layer 314 may be elongated in the third direction D3. For example, the gate dielectric layer 314 is interposed between the active layer 316 and the gate electrode 314 in the first direction D1 and also interposed between the source/drain electrode 218 and the gate electrode 312. For example, in a side view (not shown), the gate electrode 312 may completely overlap the top electrode 2182 and may at least partially (or fully) overlap the bottom electrode 2181. In some embodiments, the gate dielectric layer 314 includes an L-shape cross section. For example, the gate electrode 312 may include a sidewall and a bottom surface that are covered by the gate dielectric layer 314.

Figure 7A:
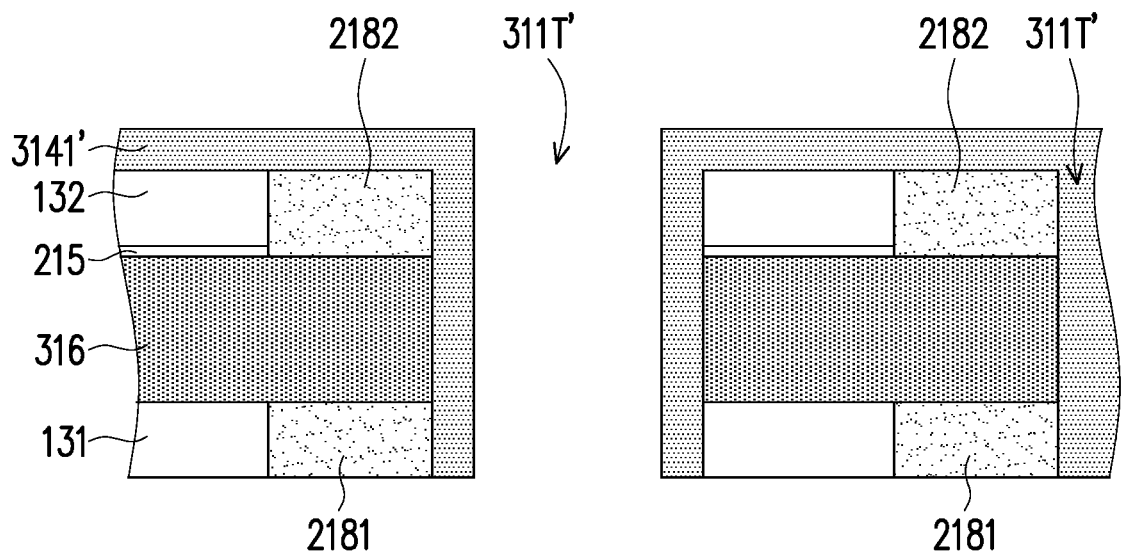
FIGS. 7A and 7B are cross-sectional views illustrating various stages of a manufacturing method of a transistor according to some embodiments.
Figure 7B:
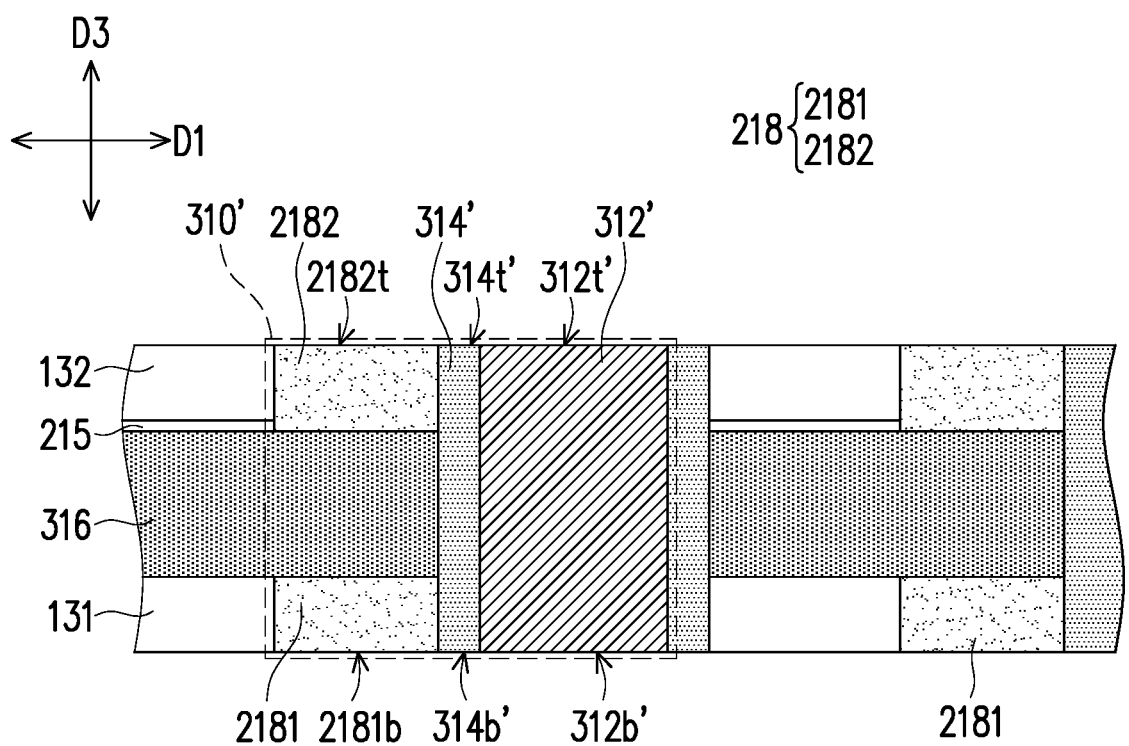

FIGS. 7A and 7B are cross-sectional views illustrating various stages of a manufacturing method of a transistor according to some embodiments. Unless specified otherwise, the materials and the formation methods of the components in these embodiments are essentially the same as the like components, which are denoted by like reference numerals in the embodiments shown in FIGS. 6A-6E. The details regarding the formation process and the materials of the components shown in FIGS. 7A-7B may thus be found in the discussion of the embodiments shown in FIGS. 6A-6E.

Referring to FIG. 7A, the structure is similar to the structure shown in FIG. 6D, except for the gate dielectric material layer 3141'. For example, the gate dielectric material layer 3141' accessibly exposes the bottom end of the trench 311T'. In some embodiments, after deposition of the gate dielectric material layer as described in FIG. 6D, an etching process may be performed to remove a bottom portion of the gate dielectric material layer to form the gate dielectric material layer 3141'. The sidewalls of the bottom electrodes 2181 may remain covered by the gate dielectric material layer 3141'.

Referring to FIG. 7B and with reference to FIG. 7A, the gate material layer may be formed on the gate dielectric material layer 3141' and fill the trench 311T', and then portions of the gate material layer and the underlying gate dielectric material layer 3141' may be removed to respectively form a gate electrode 312' and a gate dielectric layer 314'. The gate material layer may be similar to the material of the gate electrode 112 described in FIG. 1A and may be formed by any suitable deposition process (e.g., plating or the like). The planarization process (e.g., CMP, mechanical grinding, etching, a combination thereof, or the like) may be performed after deposition of the gate material layer for removal excess materials until the top electrodes 2182 are accessibly revealed. Afterwards, a transistor 310' is provided. The transistor 310' includes the gate electrode 312' elongated in the third direction D3 and laterally covered by the gate dielectric layer 314'. For example, the top surfaces 2182t of the top electrodes 2182 is substantially leveled (e.g., coplanar) with a top surface 314t' of the gate dielectric layer 314' and a top surface 312t' of the gate electrode 312', within process variations. A bottom surface 2181b of the bottom electrode 2181 may be substantially leveled (e.g., coplanar) with a bottom surface 314b' of the gate dielectric layer 314' and a bottom surface 312b' of the gate electrode 312', within process variations.

Figure 8A:
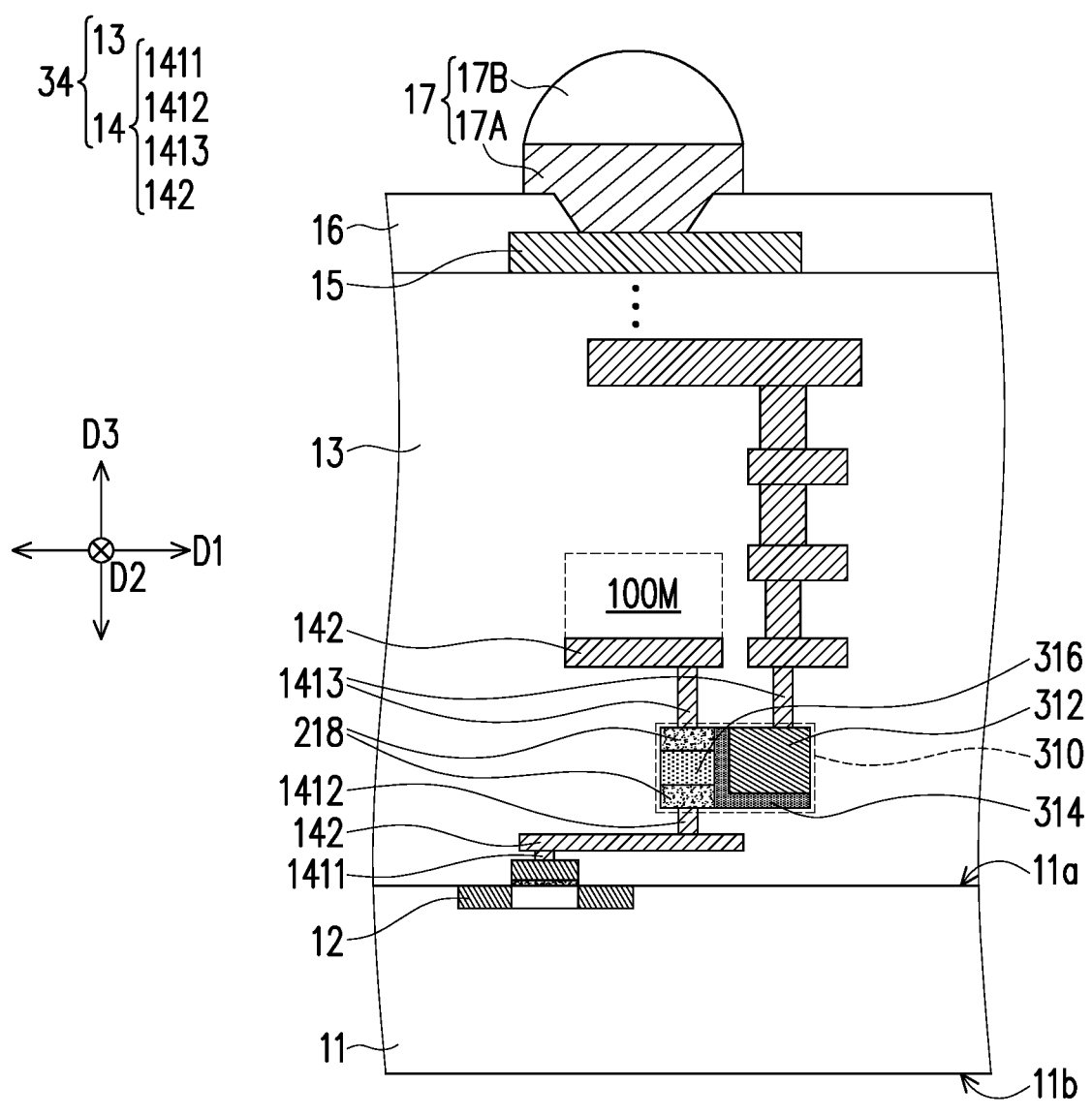
FIGS. 8A and 8B are cross-sectional views illustrating a semiconductor structure including the transistor in FIG. 6E according to some embodiments.
Figure 8B:
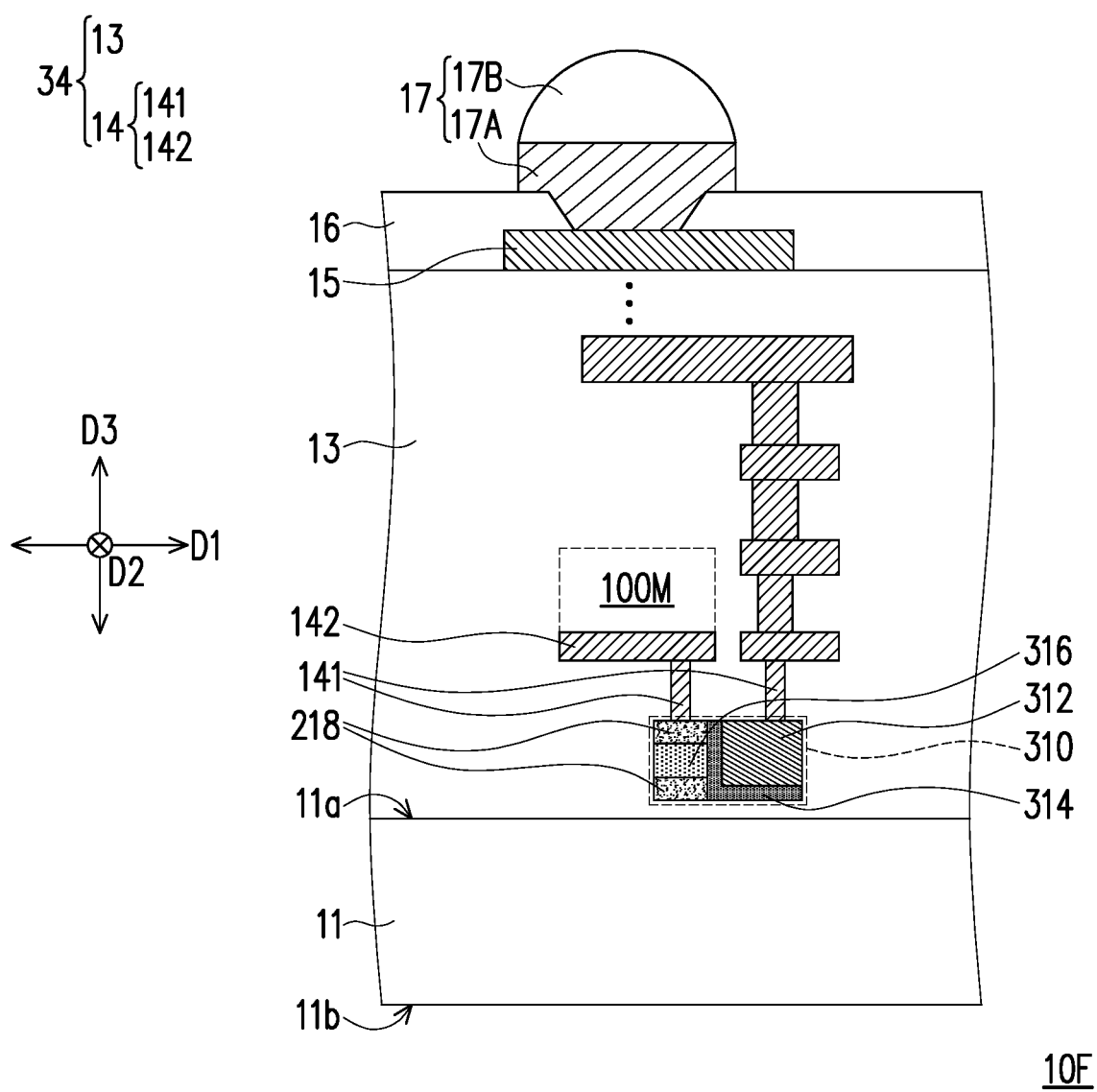

FIGS. 8A and 8B are cross-sectional views illustrating a semiconductor structure including the transistor 310 in FIG. 6E according to some embodiments. Unless specified otherwise, the materials and the formation methods of the components in these embodiments are essentially the same as the like components, which are denoted by like reference numerals in the embodiments shown in FIGS. 6A-6E. It should be appreciated that the transistor 310 illustrated in FIGS. 8A-8B may be replaced with the transistor 310' shown in FIG. 7B, in accordance with some embodiments.

Referring to FIG. 8A and with reference to FIG. 6E and FIG. 5A, a semiconductor structure 10E is similar to the semiconductor structure 10C described in FIG. 5A, except for the transistor 310. The transistor 310 of the semiconductor structure 10E may be the same as the transistor 310 described in FIG. 6E. The same/similar elements are denoted by the same/similar reference numerals, and the detailed descriptions thereof are omitted herein. The transistor 310 of the semiconductor structure 10E may be embedded in the dielectric layer 13 and electrically coupled to the interconnect circuitries 14. As mentioned above, the transistor 310 may be referred to as the vertical transistor, where the source/drain electrodes 218 and the active layer 316 may be arranged in the third direction D3, and the gate dielectric layer 314 and the gate electrode 312 may be arranged in the first direction D1 and elongated along the third direction D3 (e.g., the thickness direction of the semiconductor structure 10E).

The transistor 310 formed over the semiconductor substrate 11 may be electrically coupled to the device 12 through the interconnect circuitries 14 (such as 141I, 142, and 1412). In some embodiments, the transistor 310 may be electrically coupled to an external device (not shown) through the interconnect circuitries 14, the contact pad 15, and the conductive terminal 17. For example, the conductive vias 1413 at a same level may respectively land on top surfaces of the gate electrode 312 and the top electrode 2182 (labeled in FIG. 6E). In some embodiments, the transistor 310 may be electrically coupled to the memory cell structure 100M through the interconnect circuitries 14 (such as 1413 and 142). The transistor 310 and the memory cell structure 100M may be collectively referred to as a memory device, where the transistor 310 may act as a selector for the memory device. Alternatively, the memory cell structure 100M may be omitted or may be replaced with other type of BEOL devices.

Referring to FIG. 8B and with reference to FIG. 8A and FIG. 5B, a semiconductor structure 10F is similar to the semiconductor structure 10E illustrated in FIG. 8A and may be similar to the semiconductor structure 10D illustrated in FIG. 5B, with similar features being labeled with similar numerical references, and the descriptions of the similar features are not repeated herein. The difference between the semiconductor structures 10F and 10E may include that the semiconductor substrate 11 of the semiconductor structure 10F is free of active/passive device (e.g., the device 12 in FIG. 8A). On the other hand, the difference between the semiconductor structures 10F and 10D lies in the configuration of the transistor 310 in the semiconductor structure 10F, where the active layer 314 is interposed between the source/drain electrodes 218, and the gate dielectric layer 316 is in direct contact with the source/drain electrodes 218 and the active layer 314 at one side and is in direct contact with the gate electrode 312 at the opposing side.

According to some embodiments, a transistor includes a gate electrode, a gate dielectric layer covering the gate electrode, an active layer covering the gate dielectric layer and including a first metal oxide material, and source/drain electrodes disposed on the active layer and made of a second metal oxide material with an electron concentration of at least about $10^{18}$ cm$^{-3}$.

According to some alternative embodiments, a semiconductor structure includes a semiconductor substrate, an interconnect structure disposed over the semiconductor substrate, and a first transistor embedded in a dielectric layer of the interconnect structure and electrically coupled to an interconnect circuitry of the interconnect structure. The first transistor includes a gate electrode, a gate dielectric layer covering the gate electrode, an active layer covering the gate dielectric layer source/drain electrodes covering the active layer and made of a conductive metal oxide, where the interconnect circuitry lands on a planar top surface of the source/drain electrodes.

According to some alternative embodiments, a method includes at least the following steps. A transistor is formed, where the transistor includes a gate dielectric layer covering a gate electrode, an active layer covering the gate dielectric layer, and source/drain electrodes covering the active layer and made of a conductive metal oxide with an electron concentration of at least about $10^{18}$ cm$^{-3}$.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor, comprising:
 a gate electrode;
 a gate dielectric layer covering the gate electrode;
 an active layer covering the gate dielectric layer and comprising a first metal oxide material; and
 source/drain electrodes disposed on the active layer and made of a second metal oxide material with an electron concentration of at least about $10^{18}$ cm$^{-3}$, wherein the source/drain electrodes comprise a top electrode and a bottom electrode, an entire top surface of the top electrode of the source/drain electrodes is coplanar with an entire top surface of the active layer, an entire top surface of the gate dielectric layer and an entire top surface of the gate electrode.

2. The transistor of claim 1, wherein the first metal oxide material of the active layer comprises an electron concentration less than about $10^{18}$ cm$^{-3}$.

3. The transistor of claim 1, further comprising:
a spacer layer interposed between the source/drain electrodes, wherein the bottom electrode of the source/drain electrodes, the spacer layer, and the top electrode of the source/drain electrodes are stacked in sequential order in a thickness direction of the gate electrode.

4. The transistor of claim 3, wherein a cross section of the active layer and a cross section of the gate electric layer are of an L-shape.

5. The transistor of claim 1, wherein:
the bottom electrode of the source/drain electrodes, the active layer, and the top electrode of the source/drain electrodes are stacked in sequential order in a thickness direction of the gate electrode to cover a sidewall of the gate dielectric layer.

6. The transistor of claim 5, wherein a cross section of the gate electric layer is of an L-shape.

7. A semiconductor structure, comprising:
a semiconductor substrate;
an interconnect structure disposed over the semiconductor substrate; and
a first transistor embedded in a dielectric layer of the interconnect structure and electrically coupled to an interconnect circuitry of the interconnect structure, and the first transistor comprising:
a gate electrode;
a gate dielectric layer covering the gate electrode;
an active layer covering the gate dielectric layer; and
source/drain electrodes covering the active layer and made of a conductive metal oxide, wherein the interconnect circuitry lands on a top surface of the source/drain electrodes, wherein the top surface of the source/drain electrodes is entirely coplanar with a top surface of the active layer, a top surface of the gate dielectric layer and a top surface of the gate electrode.

8. The semiconductor structure of claim 7, further comprising:
a second transistor embedded in the semiconductor substrate and electrically coupled to the interconnect circuitry of the interconnect structure.

9. The semiconductor structure of claim 7, wherein the semiconductor substrate is free of transistor.

10. The semiconductor structure of claim 7, wherein:
the active layer of the first transistor is made of a first metal oxide material, and
the source/drain electrodes are made of a second metal oxide material with an electron concentration of at least about $10^{18}$ cm$^{-3}$.

11. The semiconductor structure of claim 7, wherein the first transistor further comprises:
a spacer layer interposed between a bottom electrode of the source/drain electrodes and a top electrode of the source/drain electrodes, wherein a top surface of the top electrode is substantially leveled with the top surface of the gate electrode, the top surface of the gate dielectric layer, and the top surface of the active layer.

12. The semiconductor structure of claim 7, wherein:
the active layer is interposed between a bottom electrode of the source/drain electrodes and a top electrode of the source/drain electrodes, wherein a top surface of the top electrode is substantially leveled with the top surfaces of the gate electrode and the gate dielectric layer.

13. The semiconductor structure of claim 7, further comprising:
a contact pad disposed on the interconnect structure; and
a conductive terminal landing on the contact pad.

14. The semiconductor structure of claim 7, wherein the interconnect circuitry lands on the top surface of the gate electrode.

15. The semiconductor structure of claim 7, wherein the interconnect circuitry includes a conductive via, and the conductive via lands on the top surface of the source/drain electrodes.

16. A method, comprising:
forming a transistor, wherein the transistor comprises:
a gate dielectric layer covering a gate electrode;
an active layer covering the gate dielectric layer and comprising a first metal oxide material; and
source/drain electrodes covering the active layer and made of a second metal oxide material with an electron concentration of at least about $10^{18}$ cm$^{-3}$, wherein the source/drain electrodes comprise a top electrode and a bottom electrode, an entire top surface of the top electrode of the source/drain electrodes is coplanar with an entire top surface of the active layer, an entire top surface of the gate dielectric layer and an entire top surface of the gate electrode.

17. The method of claim 16, wherein forming the transistor comprises:
forming the top electrode over the bottom electrode, wherein the top electrode and the bottom electrode act as the source/drain electrodes; and
forming the gate dielectric layer and the gate electrode to laterally overlap the top electrode and the bottom electrode.

18. The method of claim 17, wherein forming the transistor further comprises:
forming a spacer layer on the bottom electrode;
forming the top electrode on the spacer layer;
forming layers of an active material, a gate dielectric material, a gate electrode material in a sequential order to laterally overlap a stack of the bottom electrode, the spacer layer, and the top electrode; and
planarizing the layers of the active material, the gate dielectric material, the gate electrode material to respectively form the active layer, the gate dielectric layer, and the gate electrode.

19. The method of claim 17, wherein forming the transistor further comprises:
forming the active layer on the bottom electrode;
forming the top electrode on the active layer;
forming layers of a gate dielectric material and a gate electrode material in a sequential order to laterally overlap a stack of the bottom electrode, the active layer, and the top electrode; and
planarizing the layers of the gate dielectric material and the gate electrode material to respectively form the gate dielectric layer and the gate electrode.

20. The method of claim 16, further comprising:
forming a first dielectric sublayer over a semiconductor substrate, wherein the transistor is embedded in the first dielectric sublayer over the semiconductor substrate; and
forming an interconnect circuitry over the first dielectric sublayer to electrically couple the transistor.

* * * * *